(12) United States Patent
Huang et al.

(10) Patent No.: US 12,080,715 B2
(45) Date of Patent: Sep. 3, 2024

(54) SEMICONDUCTOR DEVICE WITH VARYING GATE DIMENSIONS AND METHODS OF FORMING THE SAME

(71) Applicant: Taiwan Semiconductor Manufacturing Company, Ltd., Hsin-Chu (TW)

(72) Inventors: Guan-Wei Huang, Hsinchu (TW); Yu-Shan Lu, Zhubei (TW); Yu-Bey Wu, Hsinchu (TW); Jiun-Ming Kuo, Taipei (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 327 days.

(21) Appl. No.: 17/407,566

(22) Filed: Aug. 20, 2021

(65) Prior Publication Data
US 2023/0054372 A1 Feb. 23, 2023

(51) Int. Cl.
*H01L 27/092* (2006.01)
*H01L 21/02* (2006.01)
(Continued)

(52) U.S. Cl.
CPC ...... *H01L 27/0922* (2013.01); *H01L 21/0259* (2013.01); *H01L 21/823807* (2013.01);
(Continued)

(58) Field of Classification Search
CPC ........... H01L 29/66545; H01L 27/0922; H01L 21/0259; H01L 21/823807; H01L 21/823814; H01L 21/82385; H01L 29/0665; H01L 29/42392; H01L 29/4908; H01L 29/66742; H01L 29/78618; H01L 29/78696; H01L 21/823456; H01L 27/088; H01L 29/0673; H01L 29/66439;
(Continued)

(56) References Cited

U.S. PATENT DOCUMENTS 8,716,786 B2  5/2014  Baumgartner
2012/0146157 A1*  6/2012  Baumgartner ........ H01L 29/785
257/401

(Continued)

FOREIGN PATENT DOCUMENTS

TW  201824457 A  7/2018
TW  201923850 A  6/2019

*Primary Examiner* — Nicholas J Tobergte
*Assistant Examiner* — Adin Hrnjic
(74) *Attorney, Agent, or Firm* — HAYNES AND BOONE, LLP

(57) ABSTRACT

A semiconductor structure that includes a first semiconductor fin and a second semiconductor fin disposed over a substrate and adjacent to each other, a metal gate stack disposed over the substrate, and source/drain features disposed in each of the first semiconductor fin and the second semiconductor fin to engage with the metal gate stack. The metal gate stack includes a first region disposed over the first semiconductor fin, a second region disposed over the second semiconductor fin, and a third region connecting the first region to the second region in a continuous profile, where the first region is defined by a first gate length and the second region is defined by a second gate length less than the first gate length.

20 Claims, 31 Drawing Sheets

(51) Int. Cl.
  *H01L 21/8238*   (2006.01)
  *H01L 29/06*     (2006.01)
  *H01L 29/423*    (2006.01)
  *H01L 29/49*     (2006.01)
  *H01L 29/66*     (2006.01)
  *H01L 29/786*    (2006.01)

(52) U.S. Cl.
  CPC ........ *H01L 21/823814* (2013.01); *H01L 21/82385* (2013.01); *H01L 29/0665* (2013.01); *H01L 29/42392* (2013.01); *H01L 29/4908* (2013.01); *H01L 29/66545* (2013.01); *H01L 29/66742* (2013.01); *H01L 29/78618* (2013.01); *H01L 29/78696* (2013.01)

(58) Field of Classification Search
  CPC ........ H01L 29/165; H01L 29/4966; H01L 29/7848; H01L 29/775; H01L 21/823437; H01L 21/823412; H01L 21/823431; H01L 21/823821; H01L 21/823828; H01L 27/0886; H01L 27/0924
  See application file for complete search history.

(56) References Cited

U.S. PATENT DOCUMENTS

2018/0308842 A1* 10/2018 Lee ................. H01L 21/823431
2021/0202534 A1*  7/2021 Lin ...................... H01L 29/161

\* cited by examiner

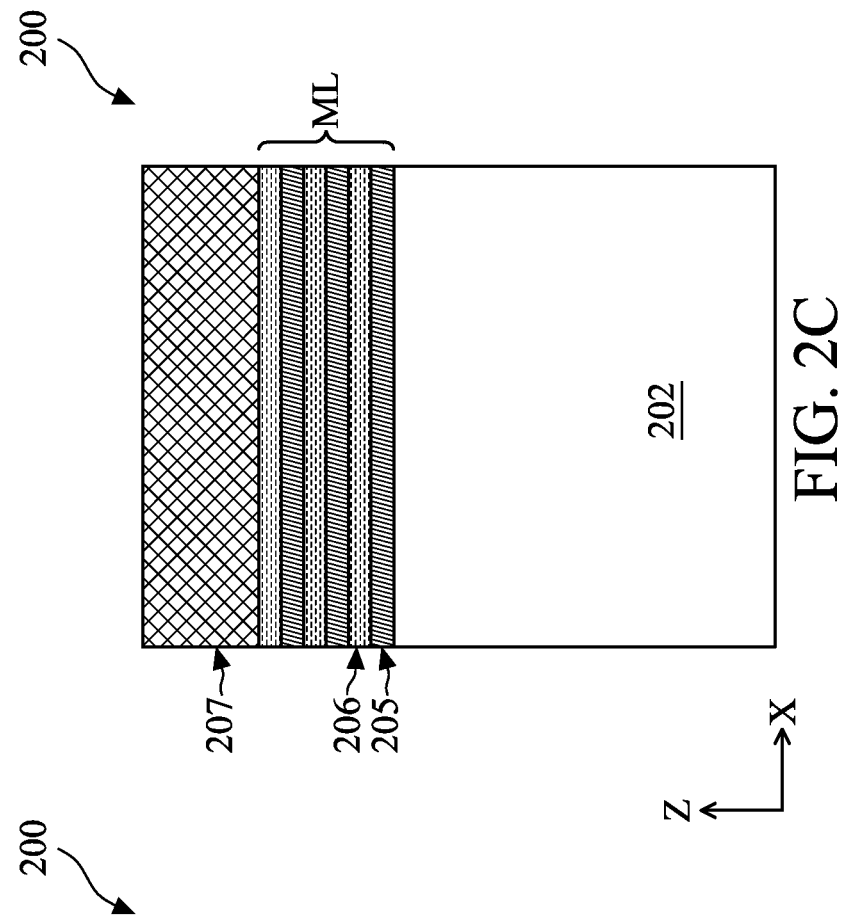
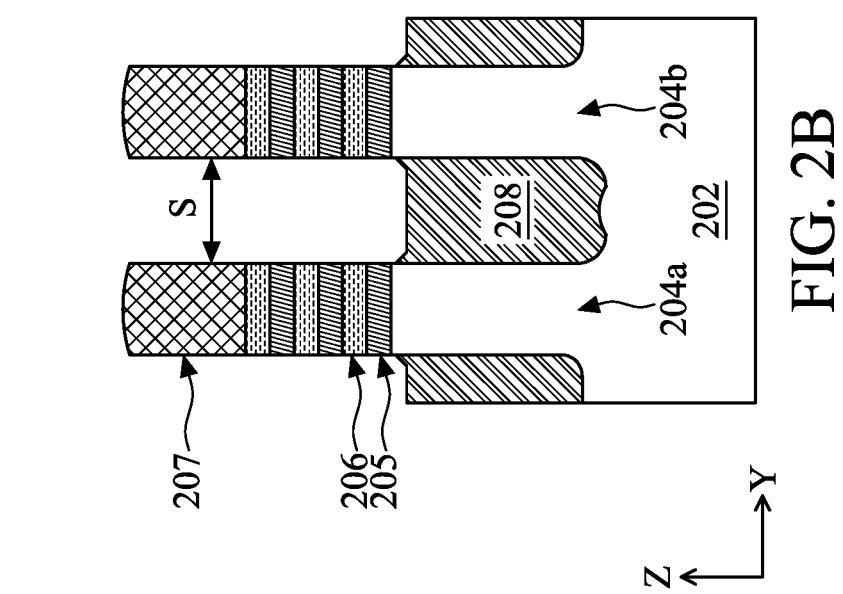

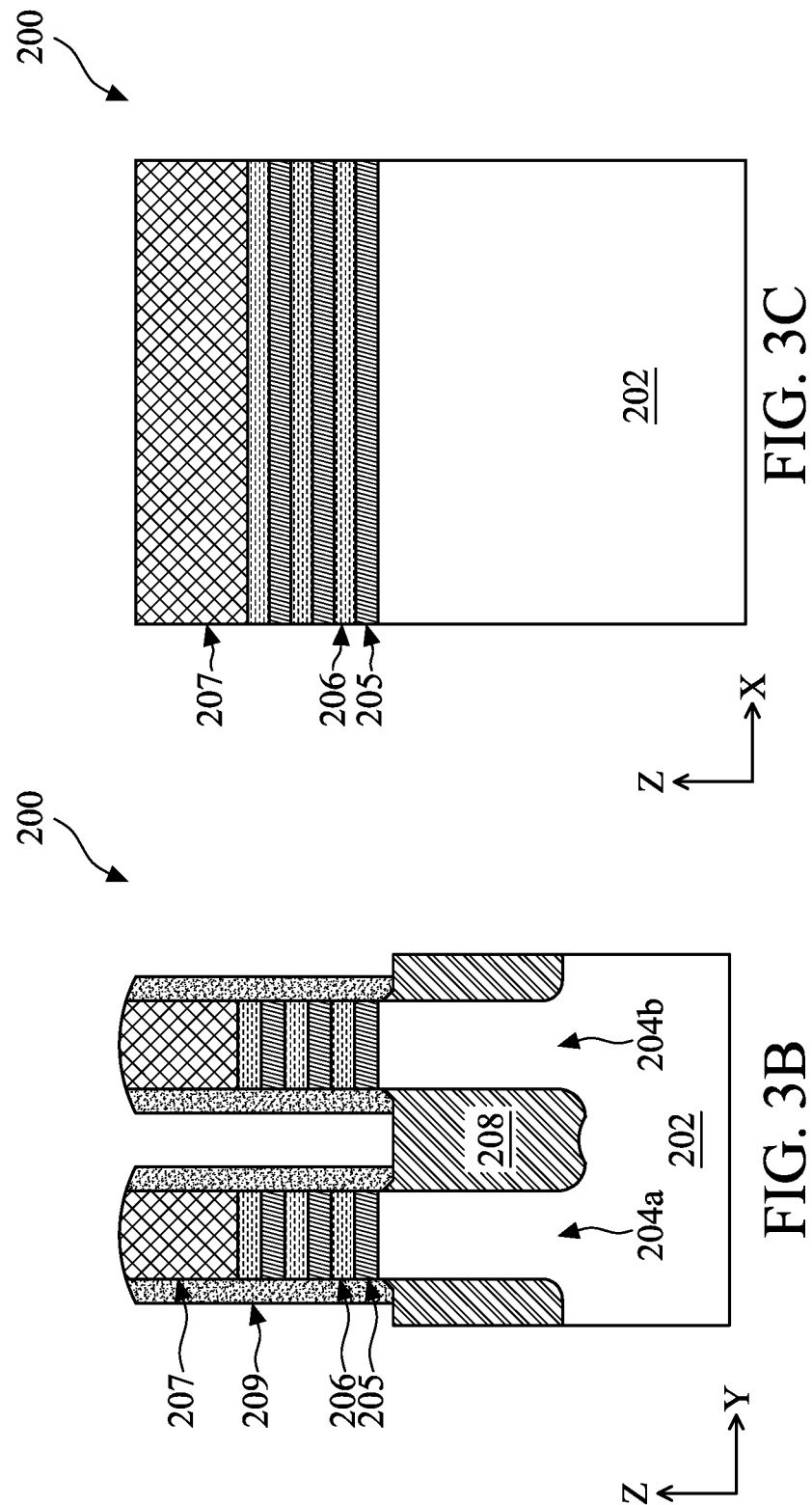

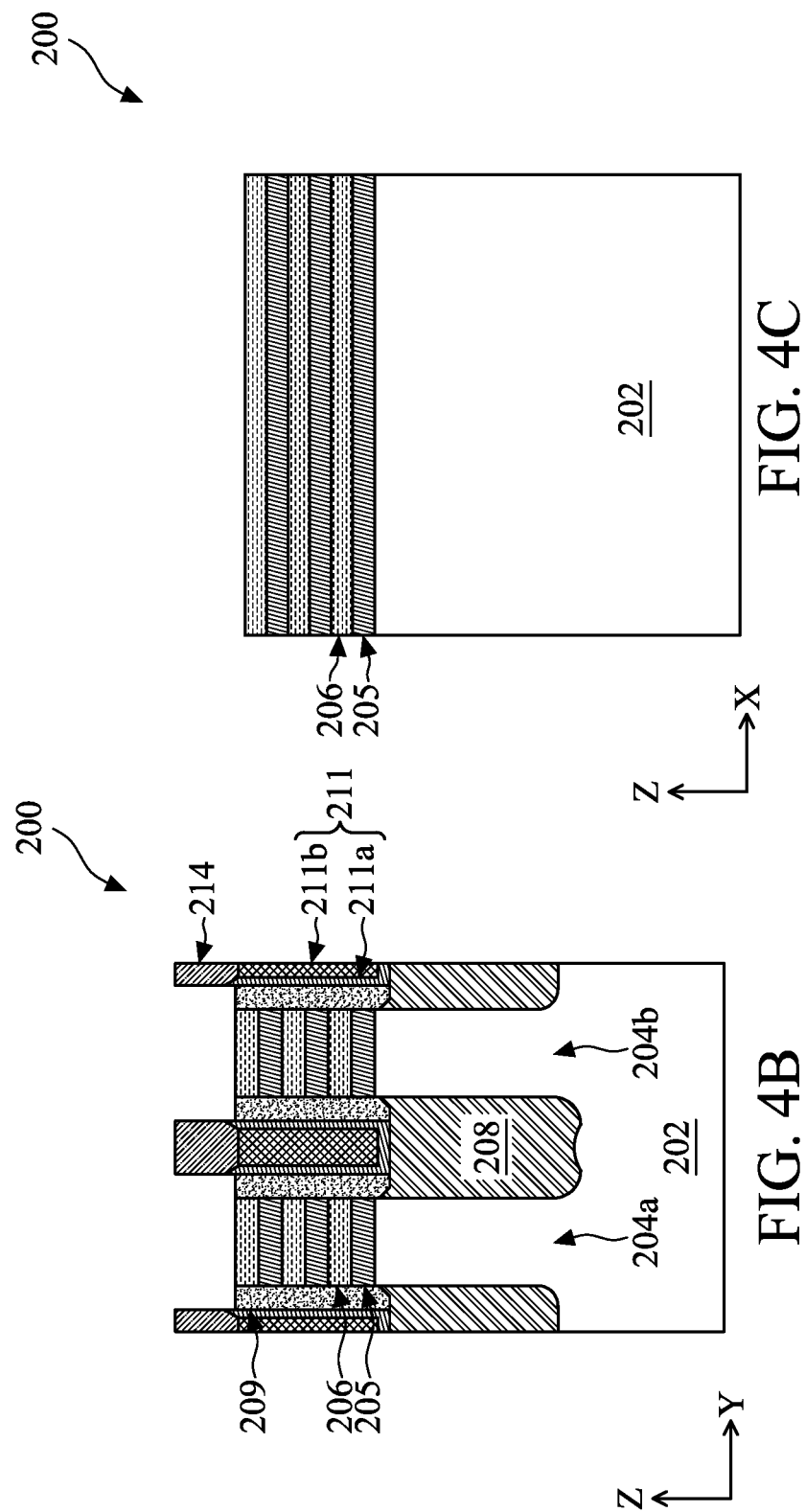

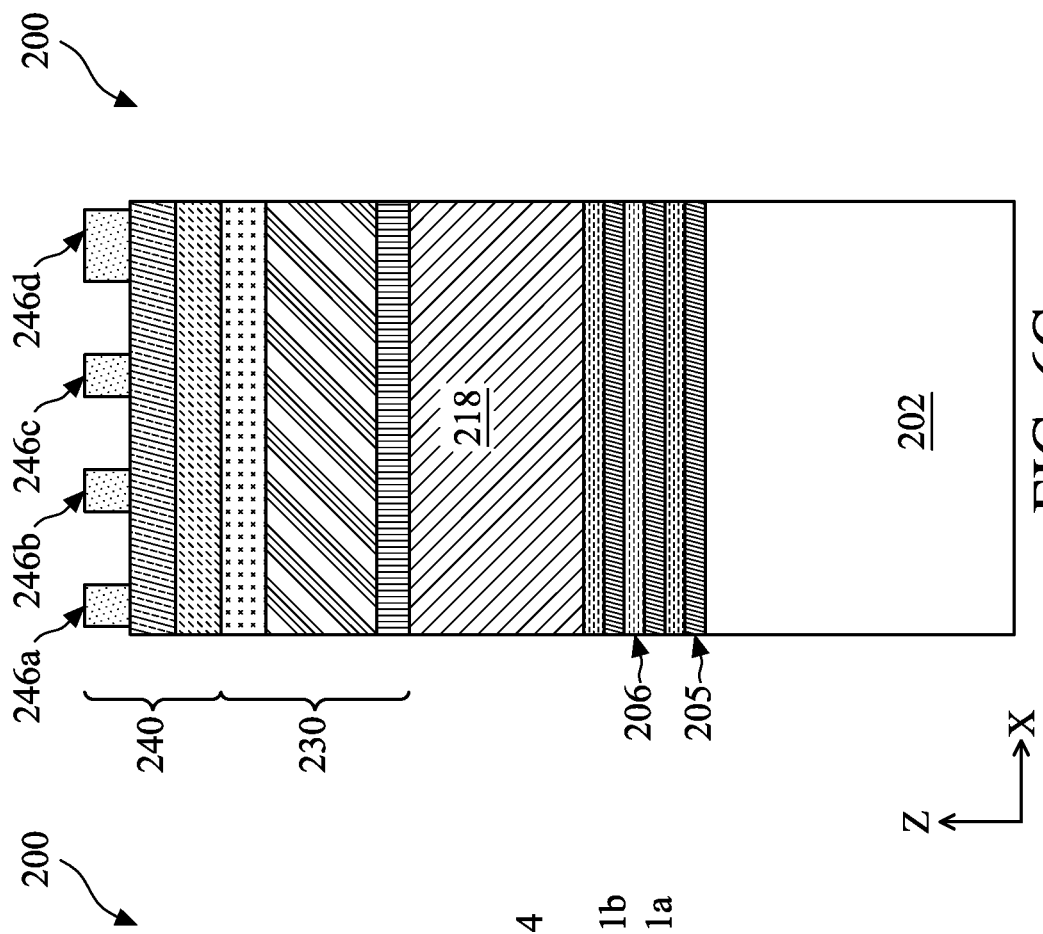
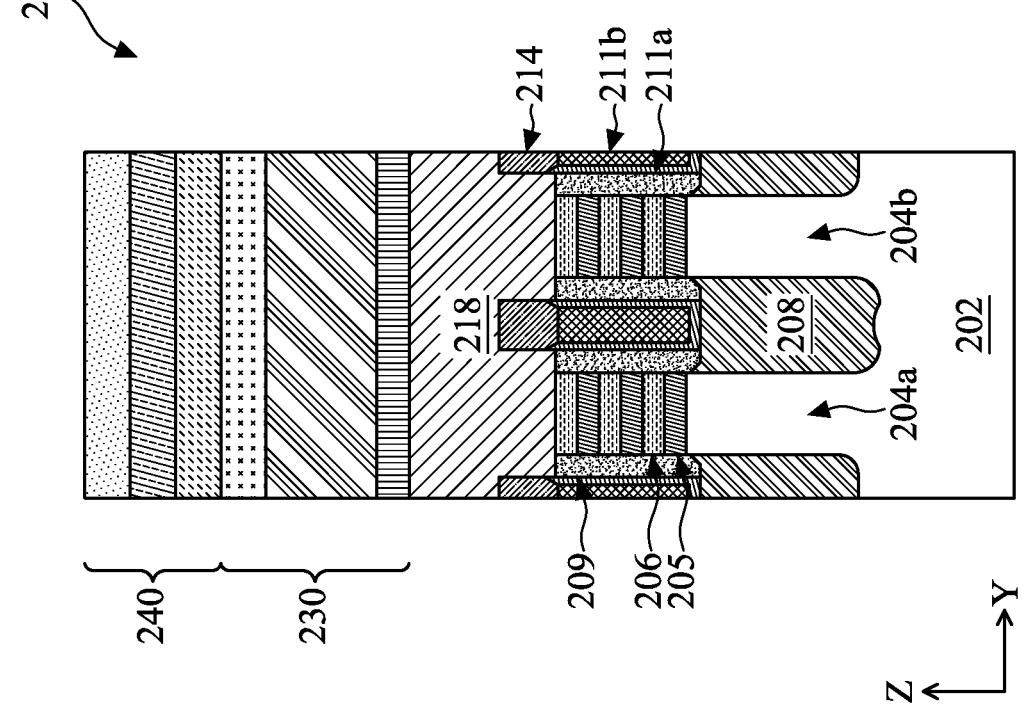
FIG. 6C
FIG. 6B

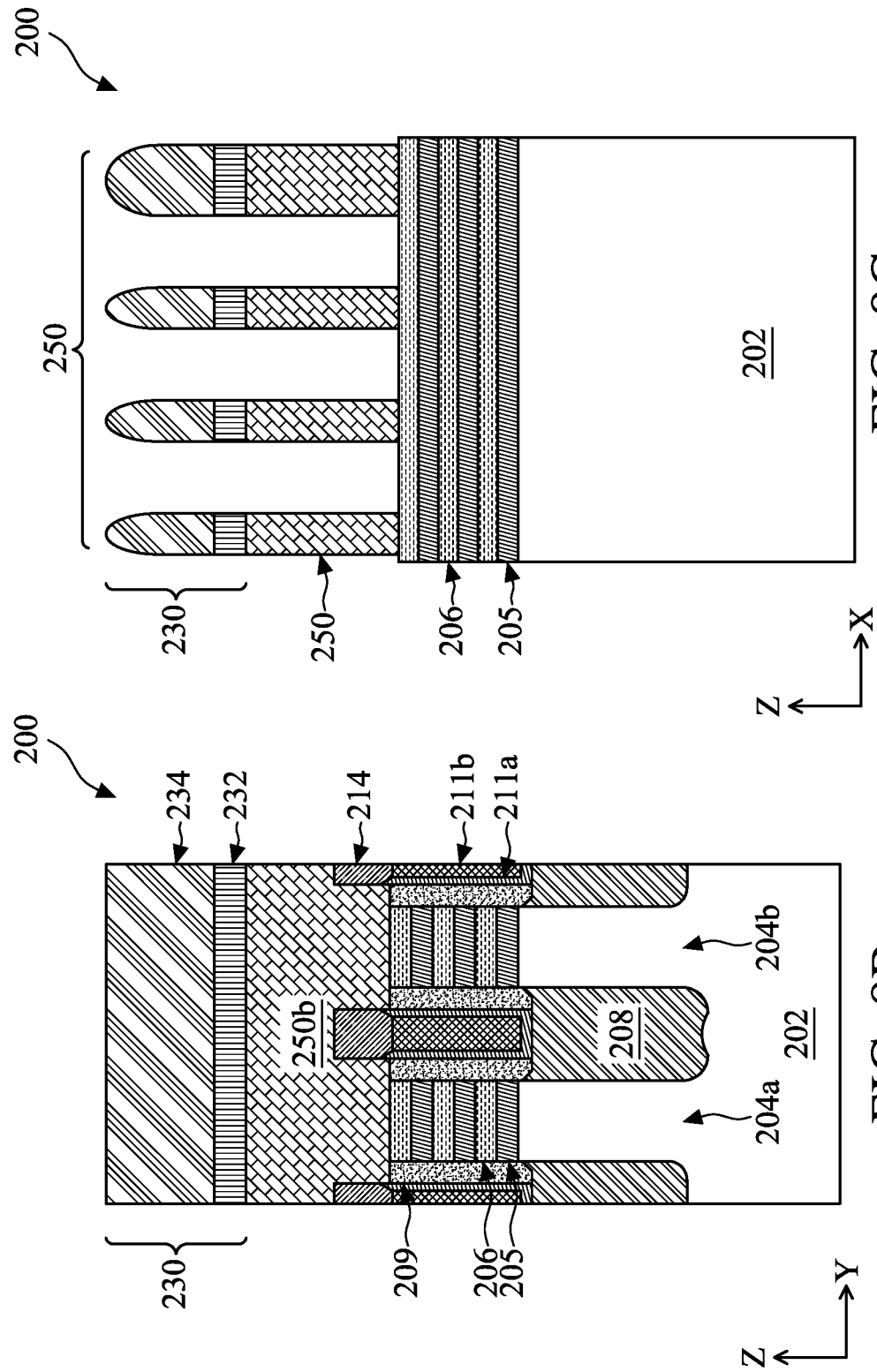

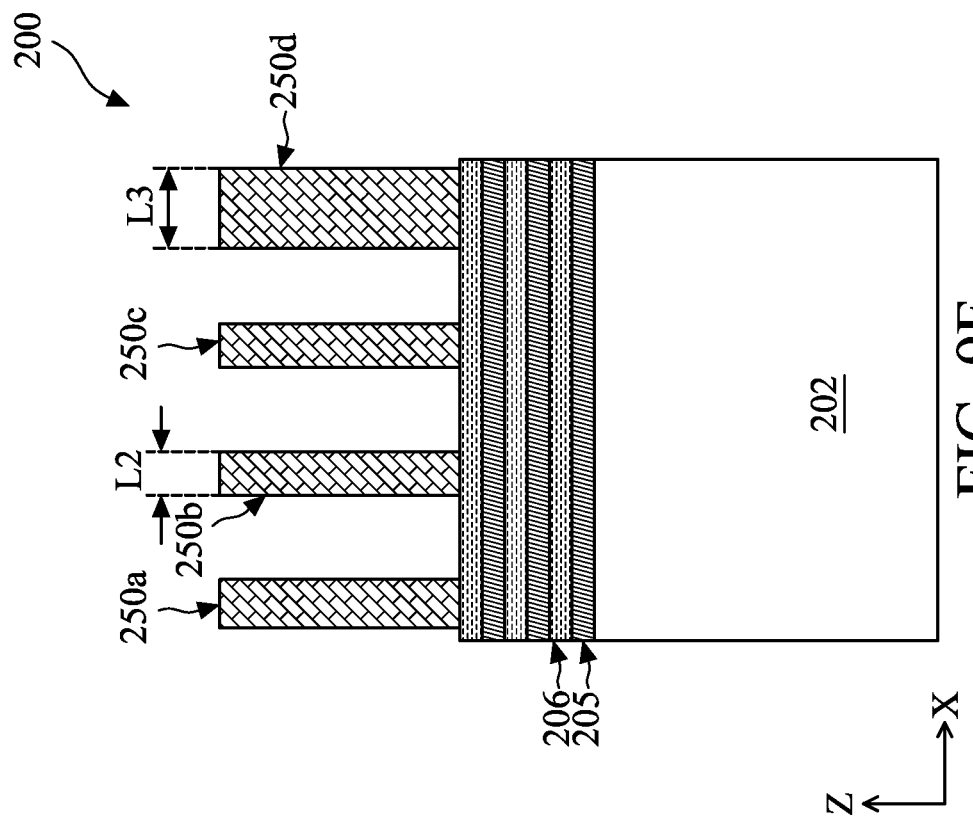
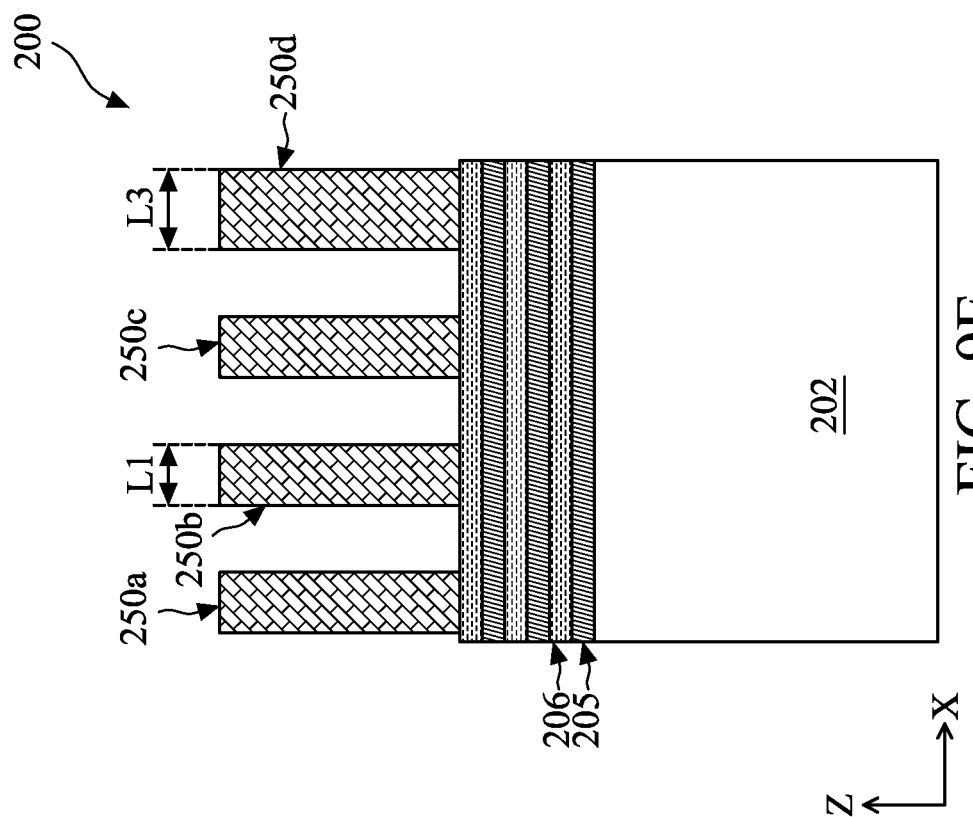

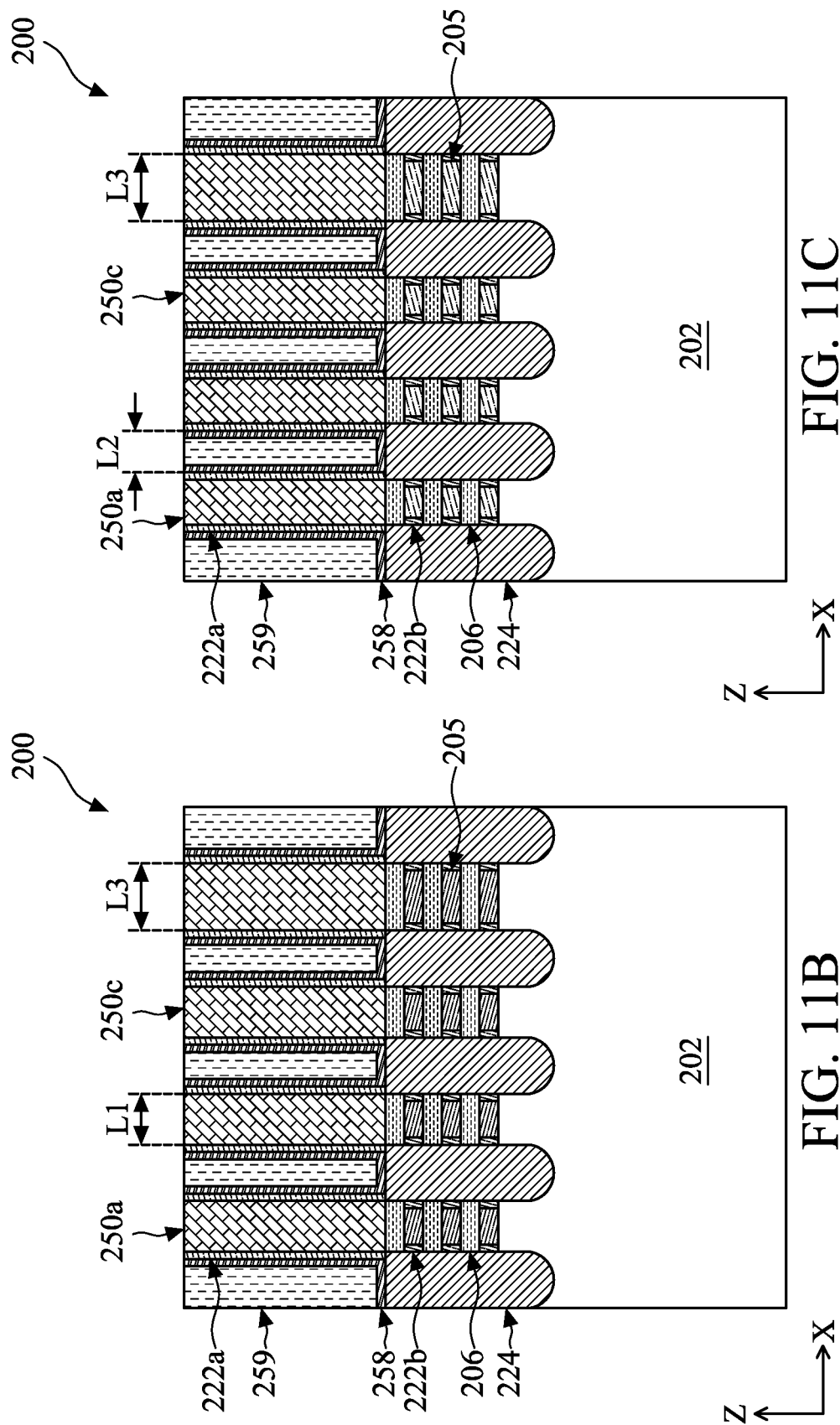

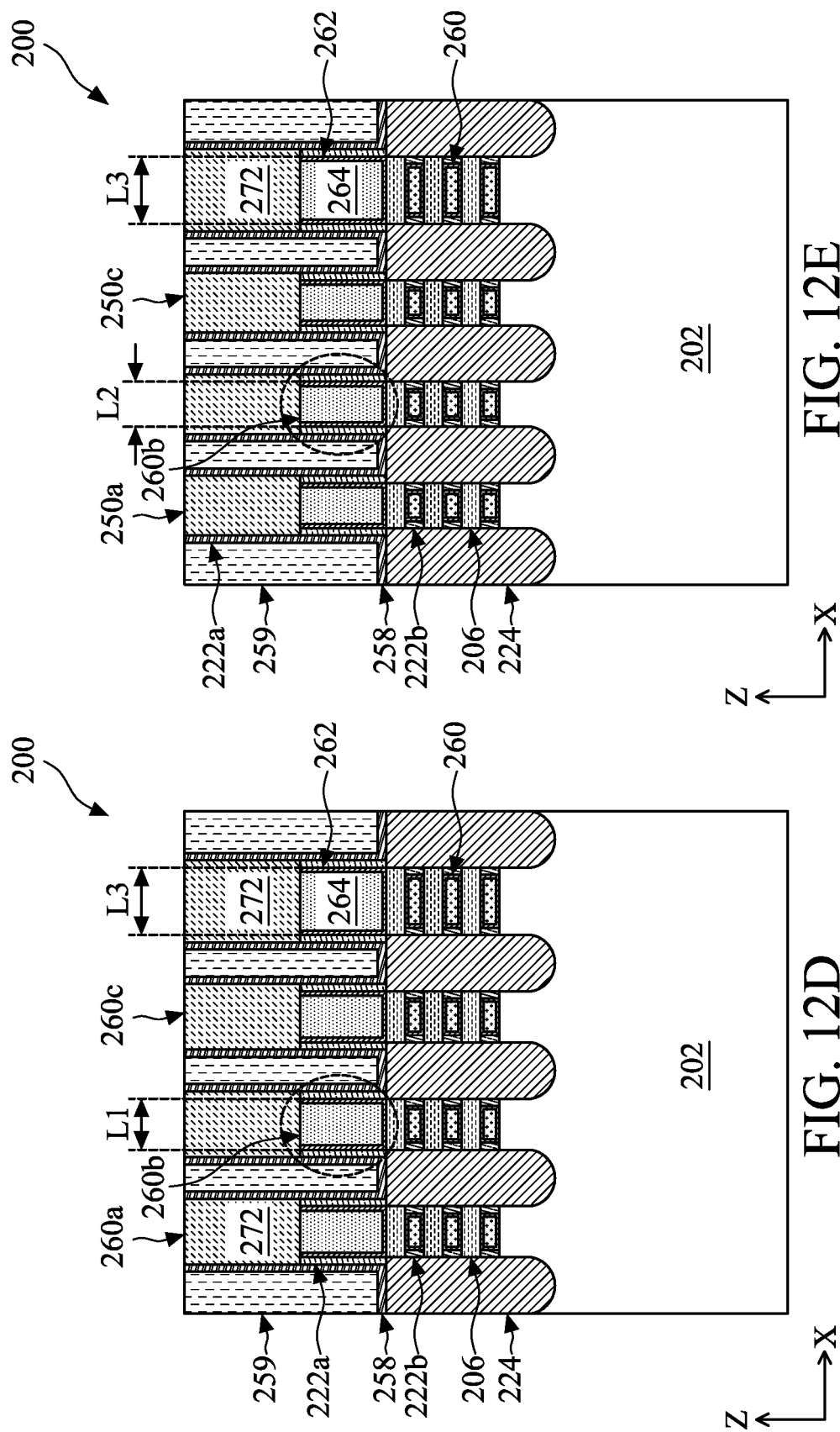

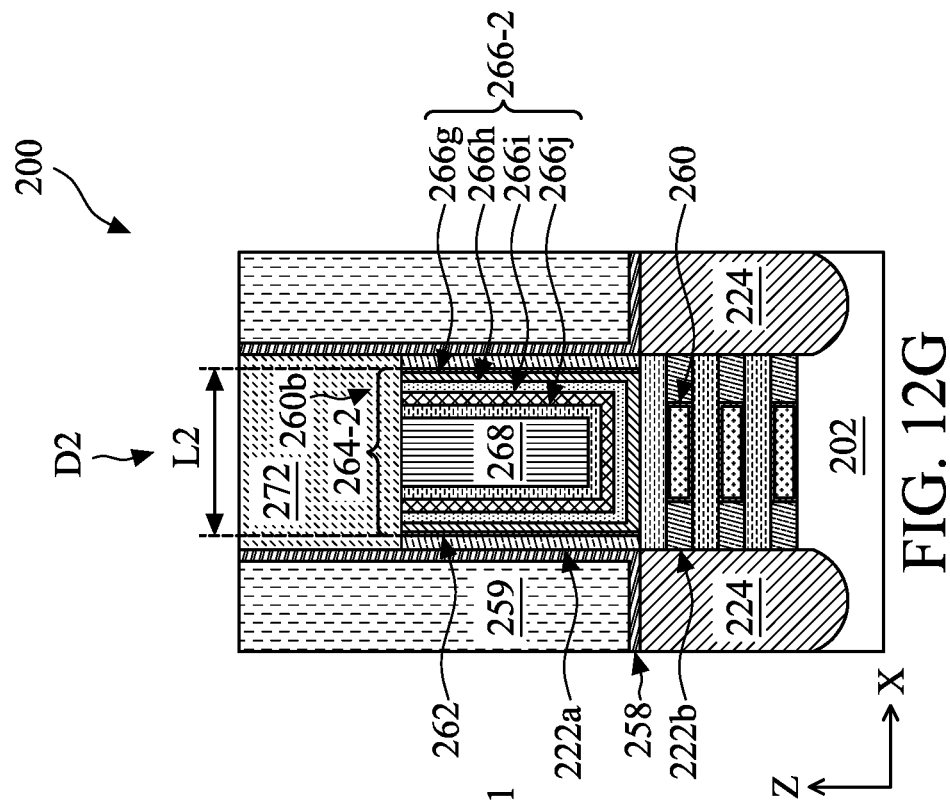
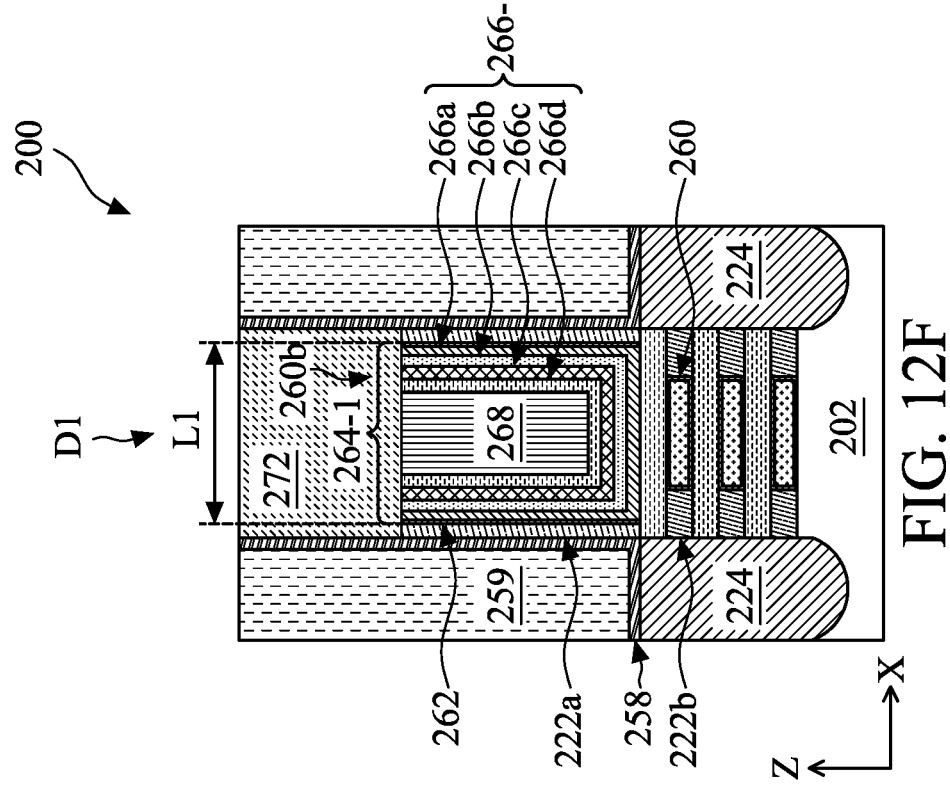

| N | $v_{t\_1}$ | $v_{t\_2}$ | $v_{t\_3}$ | $v_{t\_4}$ | $v_{t\_5}$ | $v_{t\_6}$ |
|---|---|---|---|---|---|---|
|   | WF4 | WF3 | WF3 | WF2 | WF2 | WF1 |
|   | L2 | L2 | L1 | L2 | L1 | L1 |
| P | WF5 | WF6 | WF6 | WF7 | WF7 | WF8 |
|   | L2 | L2 | L1 | L2 | L1 | L1 |

FIG. 13A

| N | $v_{t\_1}$ | $v_{t\_2}$ | $v_{t\_3}$ | $v_{t\_4}$ | $v_{t\_5}$ | $v_{t\_6}$ |
|---|---|---|---|---|---|---|
|   | WF6 | WF5 | WF4 | WF3 | WF2 | WF1 |
|   | L3 | L3 | L3 | L3 | L3 | L3 |
| P | WF7 | WF8 | WF9 | WF10 | WF11 | WF12 |
|   | L3 | L3 | L3 | L3 | L3 | L3 |

FIG. 13B

SEMICONDUCTOR DEVICE WITH VARYING GATE DIMENSIONS AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

In existing implementations, adjusting threshold voltage ($V_t$) of a metal gate stack is accomplished by changing work function metals (WFMs) included in the metal gate stack. With respect to complementary metal-oxide-semiconductor (CMOS) technology, an n-type device and its complementary p-type device are often formed with different WFMs, which generally requires multiple deposition and patterning processes to fabricate. While current methods of forming metal gate stacks with tunable $V_t$ have generally been adequate, they have not been entirely satisfactory in all aspects. For example, as feature sizes (e.g., gate lengths) continue to decrease, forming and patterning multiple WFMs becomes challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B and 2D are cross-sectional views of the example semiconductor structure along line AA' as shown in FIG. 2A at intermediate stages of the example method as shown in FIGS. 1A and/or 1B according to some embodiments of the present disclosure.

FIGS. 3B, 4B, 6B, 7B, 8B, and 12C are cross-sectional views of the example semiconductor structure along line AA' as shown in FIGS. 3A, 4A, 6A, 7A, 8A, and 12A respectively, at intermediate stages of the example method as shown in FIGS. 1A and/or 1B according to some embodiments of the present disclosure.

FIGS. 2C, 3C, 4C, 5C, 6C, 7C, and 8C are cross-sectional views of the example semiconductor structure along line BB' as shown in FIGS. 2A, 3A, 4A, 5A, 6A, 7A, and 8A, respectively, at intermediate stages of the example method as shown in FIGS. 1A and/or 1B according to some embodiments of the present disclosure.

FIGS. 9E, 10B, and 11B are cross-sectional views of the example semiconductor structure along line BB' as shown in FIG. 9A at intermediate stages of the example method as shown in FIGS. 1A and/or 1B according to some embodiments of the present disclosure.

FIGS. 9F, 10C, and 11C are cross-sectional views of the example semiconductor structure along line CC' as shown in FIG. 9A at intermediate stages of the example method as shown in FIGS. 1A and/or 1B according to some embodiments of the present disclosure.

FIGS. 12D and 12F are cross-sectional views of the example semiconductor structure along line BB' as shown in FIG. 12A at intermediate stages of the example method as shown in FIGS. 1A and/or 1B according to some embodiments of the present disclosure.

FIGS. 12E and 12G are cross-sectional views of the example semiconductor structure along line CC' as shown in FIG. 12A at intermediate stages of the example method as shown in FIGS. 1A and/or 1B according to some embodiments of the present disclosure.

FIGS. 13A and 13B each illustrate a table showing example correlations between threshold voltage, gate lengths, and work function metals in a metal gate stack according to some embodiments of the present disclosure.

DETAILED DESCRIPTION

Figure 1A:
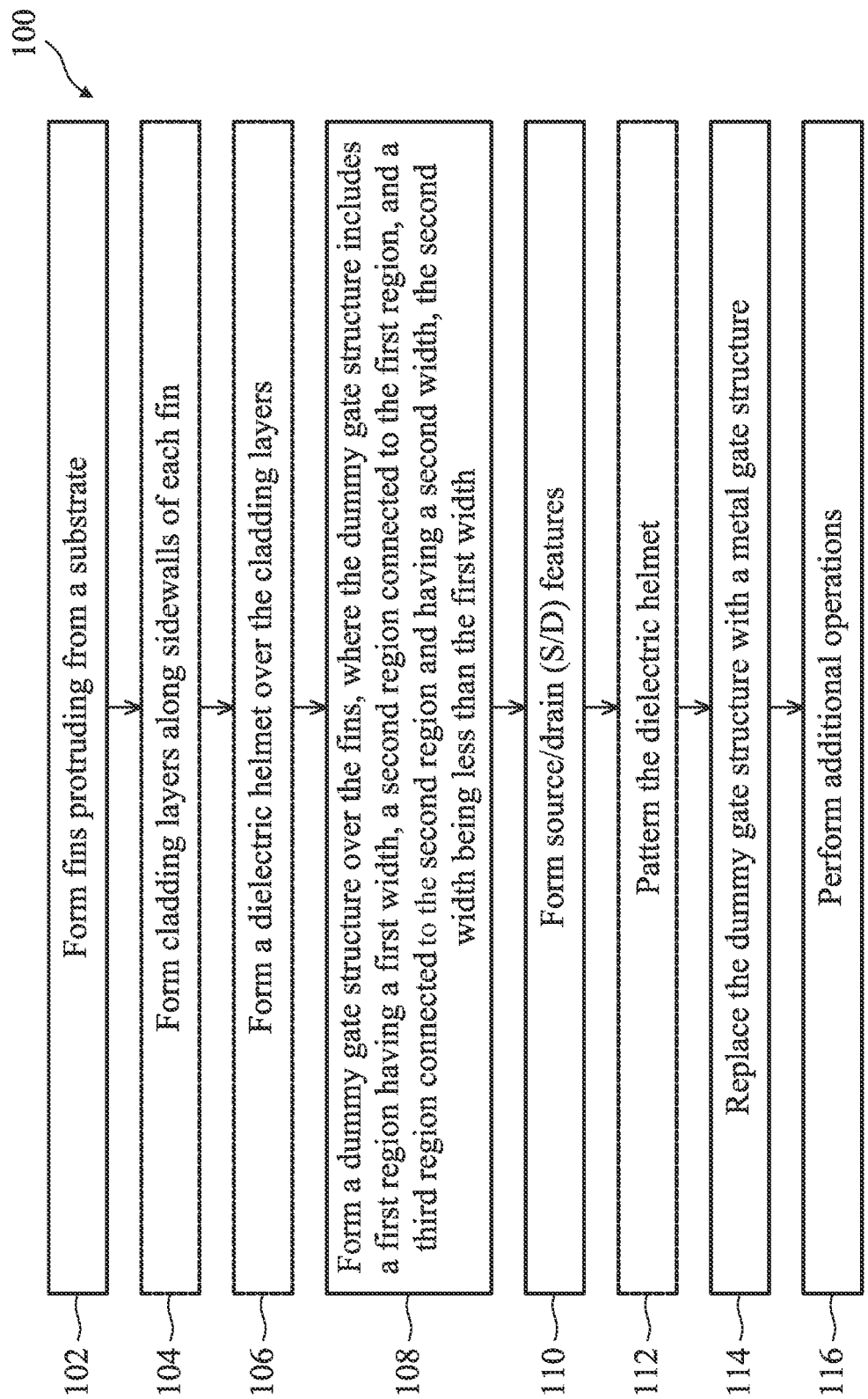
FIGS. 1A and 1B are flow charts of example methods for fabricating an example semiconductor structure according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional fin-like FETs (FinFETs), nanosheet (NS; also referred to as gate-all-around, or GAA) FETs, in memory and/or standard logic cells of an IC structure. Generally, an NS FET includes a plurality of vertically stacked sheets (e.g., nanosheets), wires (e.g., nanowires), or rods (e.g., nanorods) in a channel region of the FET. The present disclosure includes multiple embodiments. Different embodiments may have different advantages, and no particular advantage is necessarily required of any embodiment.

The present disclosure is generally related to semiconductor devices and methods of forming the same. More particularly, the present disclosure is related to semiconductor devices having varying gate dimensions (e.g., gate lengths). As advanced technology nodes continue to scale down, it has become increasingly challenging to develop devices with varying threshold voltage ($V_t$). Typically, multiple WFM layers may be required in order to engineer the devices to provide different values of $V_t$. In some instances, a given device footprint may not be able to accommodate all the WFM layers to achieve the desired values of $V_t$. In addition, processing complexity associated with forming and patterning WFM layers increases with increased number of layers needed. Accordingly, the present disclosure provides processes and methods that allow tuning of Vt at reduced length scales.

Figure 1B:
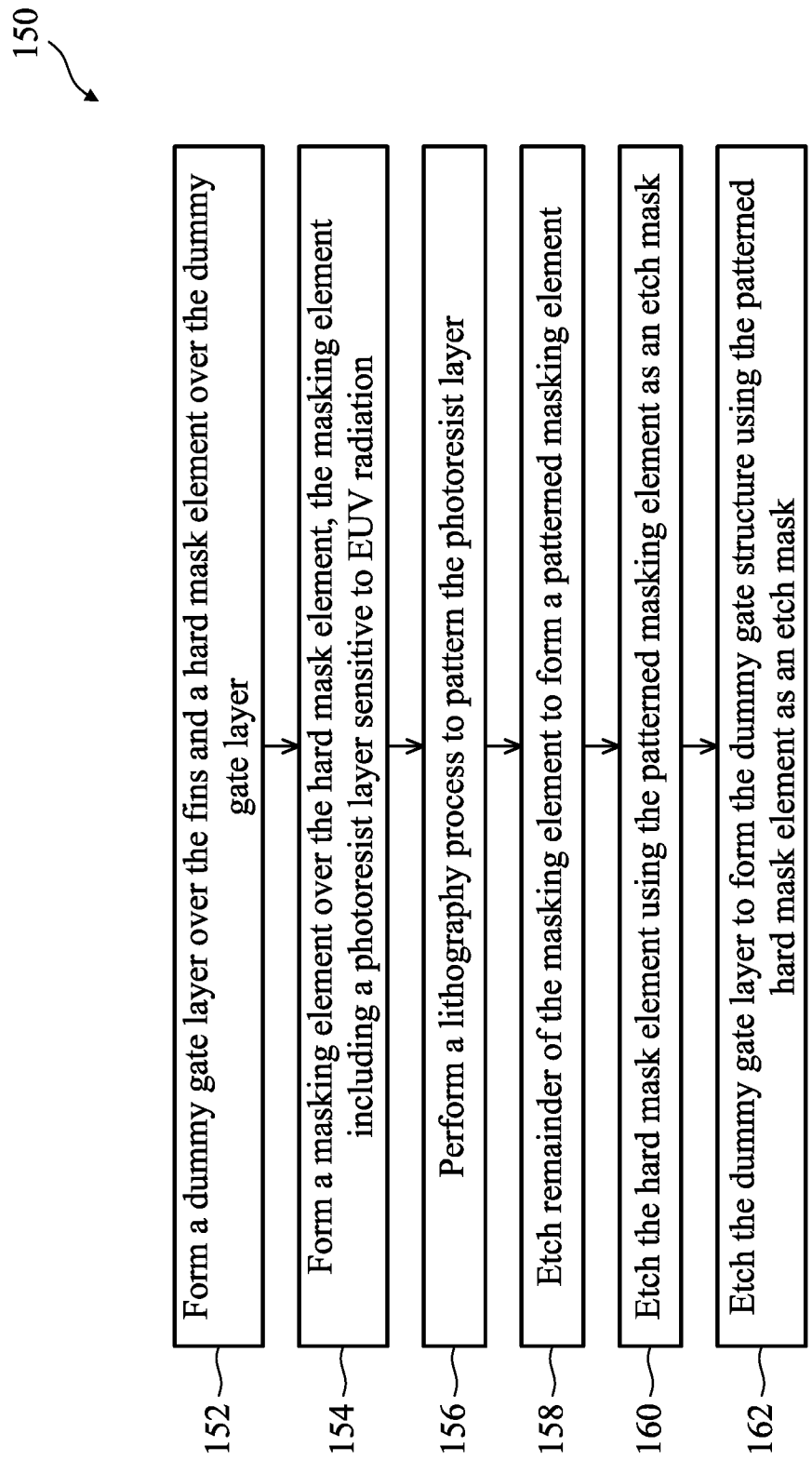

Referring now to FIGS. 1A and 1B collectively, flowcharts of methods 100 and 150 of forming a semiconductor structure (hereafter simply referred to as the structure) 200 is illustrated according to various aspects of the present disclosure. Methods 100 and 150 are merely examples and are not intended to limit the present disclosure beyond what is explicitly recited in the claims. Additional operations can be provided before, during, and after method 100 and/or method 150, and some operations described can be replaced, eliminated, or moved around for additional embodiments of the method 100 and/or 150.

The structure 200 may be an intermediate device fabricated during processing of an IC, or a portion thereof, that may comprise static random-access memory (SRAM) and/or logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

At operation 102, referring to FIGS. 1A and 2A-2D, method 100 forms the structure 200 that includes multiple active three-dimensional device regions 204a and 204b (hereafter referred to as fins 204a and 204b) protruding from a semiconductor substrate 202 (hereafter referred to as the substrate 202). As depicted herein, the structure 200 may include additional fins protruding from the substrate 202 and parallel to the fins 204a and 204b.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In some embodiments, referring to FIGS. 2B and 2C, each of the fins 204a and 204b includes a multi-layer structure (ML) of alternating non-channel layers (or sacrificial layers) 205 and channel layers 206 stacked vertically over protruding portions of the substrate 202, as well as a hard mask layer 207 over the ML. In the present embodiments, the non-channel layers 205 are sacrificial layers configured to be removed at a subsequent processing step, thereby providing openings between the channel layers 206 for forming a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each of the fins 204a and 204b may include a total of three to ten pairs of alternating non-channel layers 205 and channel layers 206. Other configurations may also be applicable depending upon specific design requirements.

In the present embodiments, the hard mask layer 207 is a sacrificial layer configured to facilitate the formation of a gate isolation feature (discussed in detail below) and subsequently be removed from the structure 200. As such, a thickness of the hard mask layer 207 may be adjusted based on the desired thickness of the gate isolation feature. In some embodiments, the thickness of the hard mask layer 207 is greater than a thickness of the non-channel layers 205 and the channel layers 206. The hard mask layer 207 may include any suitable material, such as a semiconductor material, so long as its composition is different from that of the subsequently-formed gate isolation feature and the channel layer 206 disposed thereunder to allow selective removal by an etching process. In some embodiments, the hard mask layer 207 has a composition similar to or the same as that of the non-channel layers 205 and includes, for example, SiGe.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET. For embodiments in which the hard mask layer 207 has the same composition as the non-channel layers 205, the hard mask layer 207 may also be formed by a similar epitaxy process as discussed herein.

Figure 2A:
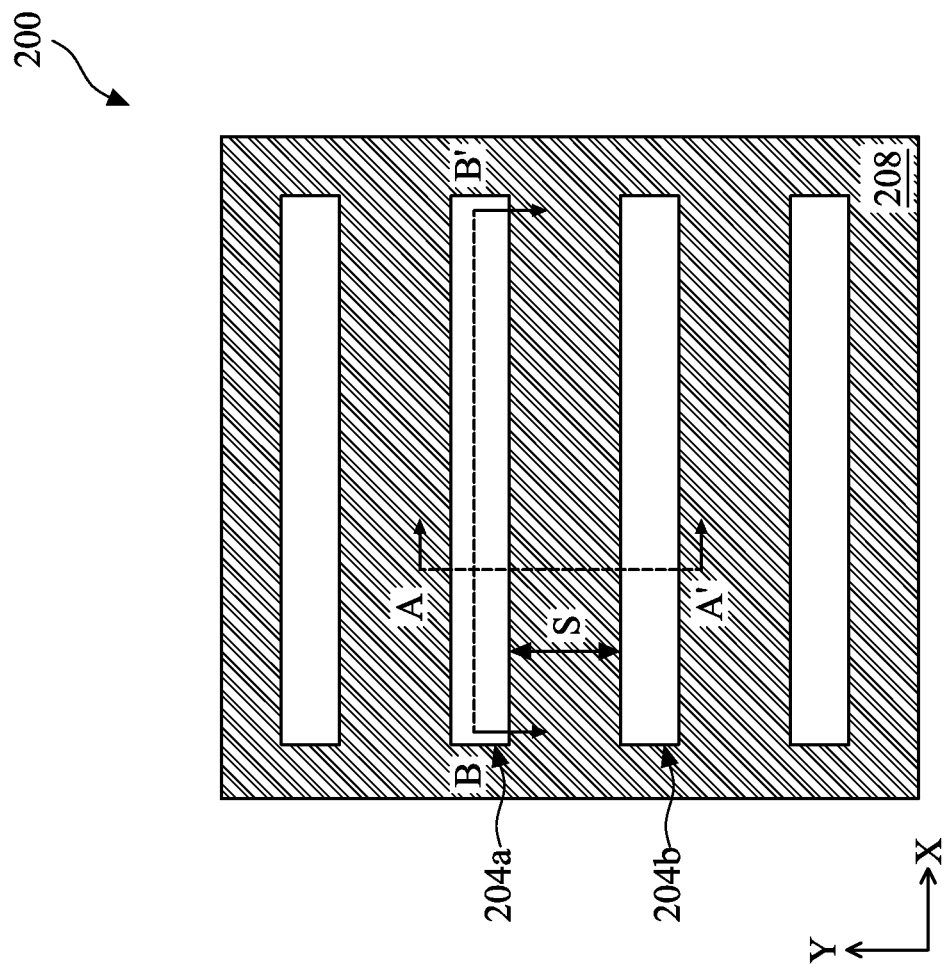
FIGS. 2A, 3A, 4A, 5A, 6A, 7A, 8A, 9A, 9B, 9C, 12A, and 12B are planar top views of the example semiconductor structure at intermediate stages of the example method as shown in FIGS. 1A and/or 1B according to some embodiments of the present disclosure.
Figure 2D:
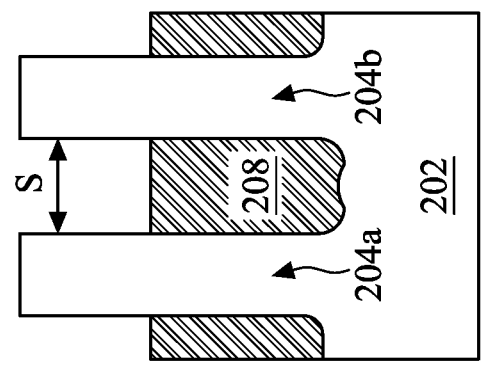
Figure 3A:
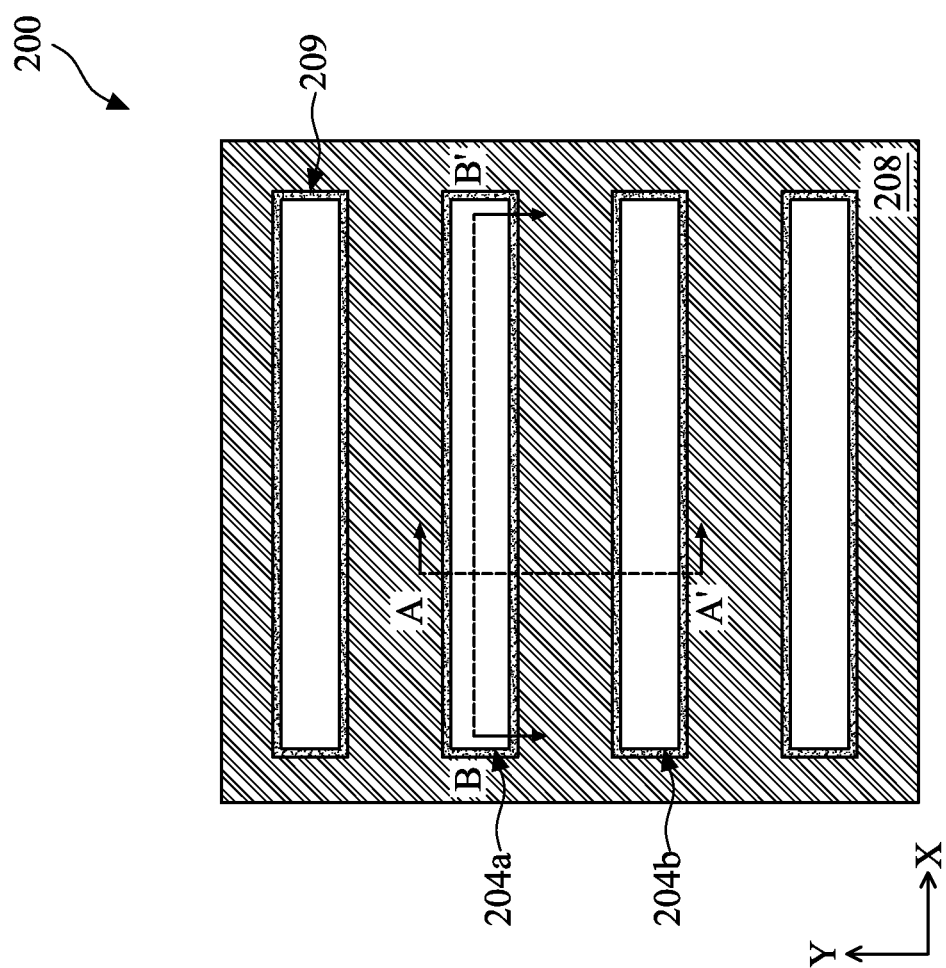

In some embodiments, as depicted in FIG. 2D, each of the fins 204a and 204b includes a single semiconductor layer, i.e., having a uniform composition along a height of the fin, that protrudes from the substrate 202. The present disclosure is not limited by the configuration of the fins 204a and 204b. For embodiments in which the ML is employed, subsequent operations 104 and 106 are applied to the fins 204a and 204b before forming a dummy gate structure at operation 108. For embodiments in which the fins 204a and 204b each include a uniform composition, operations 104 and 106 may be omitted and the dummy gate structure may be formed over the fins 204a and 204b after operation 102 (see FIG. 5D).

In the present embodiments, the fins 204a and 204b are fabricated from the ML (and the hard mask layer 207 disposed thereover) and/or the substrate 202 using a series of photolithography and etching processes. For example, the photolithography process may include forming a photoresist layer overlying the structure 200, exposing the photoresist layer to a pattern, performing post-exposure bake processes, and developing the exposed photoresist layer to form a patterned masking element (not depicted). The ML and/or the substrate 202 are then etched using the patterned masking element as an etch mask, thereby leaving the fins 204a and 204b protruding from the substrate 202. The etching process may include dry etching, wet etching, reactive ion etching (RIE), other suitable processes, or combinations thereof. The patterned masking element is subsequently removed from the structure 200 using any suitable process, such as ashing and/or resist stripping.

Numerous other embodiments of methods to form the fins 204a and 204b may be suitable. For example, the fins 204a and 204b may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used to pattern the fins 204a and 204b. In some embodiments, referring to FIGS. 2A, 2B, and 2D, the fins 204a and 204b are separated by a distance S, which may range from about 20 nm to about 100 nm and is not limited in the present embodiments.

Subsequently, method 100 at operation 102 forms isolation features 208 between the fins 204a and 204b, where a top surface of the isolation features 208 is below the bottommost non-channel layer 205. The isolation features 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof.

The isolation features 208 may include shallow trench isolation (STI) features. In some embodiments, the isolation features 208 are formed by filling trenches that separate the fins 204a and 204b with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. The isolation features 208 may include a single-layer structure or a multi-layer structure.

At operation 104, referring to FIGS. 1A and 3A-3C, method 100 forms cladding layers 209 along sidewalls of the fins 204a and 204b and over the isolation features 208. In the present embodiments, the cladding layers 209 and the non-channel layers 205 are sacrificial layers configured to be replaced with a metal gate stack in a channel region of the fin 204. In the present embodiments, the cladding layers 209 have the same composition as the non-channel layers 205 and include SiGe. In some embodiments, the cladding layers 209 are grown epitaxially by a suitable method discussed above with respect to forming the ML. In some embodiments, the cladding layers 209 are deposited conformally, rather than grown epitaxially, over surfaces of the structure 200 as a blanket amorphous layer. In some examples, the cladding layers 209 may be formed to a thickness of about 5 nm to about 10 nm. Subsequently, method 100 performs an etching process to selectively remove portions of the cladding layer 209, thereby exposing portions of the isolation features 208 and a top surface of the hard mask layer 207. The etching process may include a dry etching process, a wet etching process, a reactive ion etching (RIE) process, or combinations thereof.

At operation 106, referring to FIGS. 1A and 4A-4C, method 100 forms a dielectric helmet 214 over the isolation features 208. In the present embodiments, forming the dielectric helmet 214 includes first forming a dielectric structure 211 over the isolation features 208. The dielectric structure 211 is configured to isolate adjacent fins 204a and 204b and to provide a substrate over which a dielectric helmet 214 is formed before forming the dummy gate structure. The dielectric structure 211 may include any suitable material, such as SiO and/or $SiO_2$, silicon nitride (SiN), silicon carbide (SiC), oxygen-containing silicon nitride (SiON), oxygen-containing silicon carbide (SiOC), carbon-containing silicon nitride (SiCN), FSG, a low-k dielectric material, other suitable materials, or combinations thereof. The dielectric structure 211 may include a single-layer structure or a multi-layer structure as depicted herein, where the dielectric structure 211 includes a sub-layer 211b disposed over a sub-layer 211a. In some embodiments, the sub-layer 211a includes a nitrogen-containing dielectric material, such as SiN and/or SiCN, and the sub-layer 211b includes an oxygen-containing dielectric material, such as SiO and/or $SiO_2$. In some embodiments, the dielectric structure 211 and the isolation features 208 differ in composition. The dielectric structure 211 (or each sub-layer thereof) may be deposited by any suitable method, such as CVD, FCVD, SOG, other suitable methods, or combinations thereof, and subsequently planarized by one or more CMP processes, such that a top surface of the dielectric structure 211 is substantially co-planar with a top surface of the hard mask layer 207.

Figure 4A:
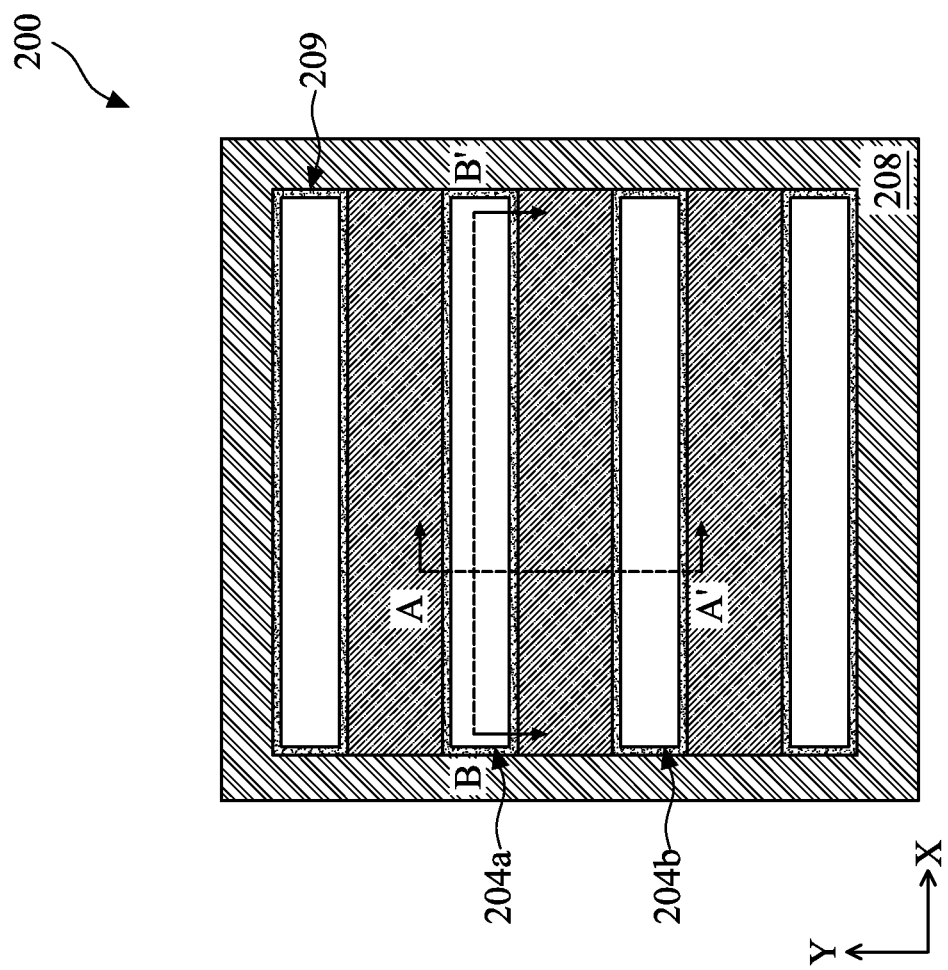

Subsequently, still referring to FIGS. 4A-4C, method 100 forms the dielectric helmet 214 over the dielectric structure 211. The dielectric helmet 214 may include SiN, SiC, SiON, SiOC, SiCN, Al$_2$O$_3$, SiO and/or SiO$_2$, a high-k dielectric material (having a k value greater than that of silicon oxide, which is about 3.9), other suitable materials, or combinations thereof. In the present embodiments, the dielectric helmet 214 includes a high-k dielectric material for enhancing the etching resistance of the dielectric helmet 214 during the subsequent processing steps. The dielectric helmet 214 may include a single-layer structure or a multi-layer structure. In some embodiments, a dielectric constant of the dielectric helmet 214 is greater than that of the dielectric structure 211 and the isolation features 208. In some embodiments, portions of the dielectric helmet 214 are configured to truncate a metal gate stack into multiple portions. In this regard, the dielectric helmet 214 may be patterned to form one or more gate isolation features (or a gate cut feature) that are self-aligned with the underlying dielectric structure 211 and between fins 204*a* and 204*b*.

Method 100 may form the dielectric helmet 214 by first recessing a top portion of the dielectric structure 211 to form trenches, such that a top surface of the recessed dielectric structure 211 is substantially co-planar with the topmost channel layer 206. In other words, the resulting trenches (not depicted) formed over the recessed dielectric structure 211 each have a thickness corresponding to the thickness of the hard mask layer 207. The etching process may include any suitable process, such as a dry etching process, a wet etching process, an RIE process, other suitable processes, or combinations thereof. Then, method 100 proceeds to depositing one or more dielectric materials in the trenches and performing a CMP process to form the dielectric helmet 214. The one or more dielectric materials may be deposited by any suitable method, such as CVD, FCVD, ALD, other suitable methods, or combinations thereof. Subsequently, method 100 removes the hard mask layer 207 from the structure 200 to expose the topmost channel layer 206 of the ML. As such, the dielectric helmet 214 protrude from top surfaces of the fins 204*a* and 204*b*. In the present embodiments, method 100 selectively removes the hard mask layer 207 without removing, or substantially removing, the dielectric helmet 214 and the topmost channel layer 206 of the ML.

Subsequently, method 100 at operation 108 forms a dummy (or placeholder) gate structure 250 over the fins 204*a* and 204*b* via a series of photolithography and etching processes, where the dummy gate structure 250 is subsequently replaced with a metal gate structure. In the present embodiments, forming the dummy gate structure 250 is implemented by method 150 including operations 152-162 as depicted in FIG. 1B.

Referring to FIGS. 1B and 5A-5D, method 150 at operation 152 forms a dummy gate layer 218 over the fins 204*a* and 204*b*. The dummy gate layer 218 may include a dummy gate electrode (not depicted separately) disposed over an optional dummy gate dielectric layer and/or an interfacial layer (not depicted separately). The dummy gate electrode may include polysilicon (poly-Si), the dummy gate dielectric layer may include a suitable dielectric material (e.g., SiO and/or SiO$_2$, SiON, etc.), and the interfacial layer may include an oxide material (e.g., SiO and/or SiO$_2$). Other materials may also be applicable for the present embodiments. Various layers of the dummy gate layer 218 may be formed by methods such as thermal oxidation, chemical oxidation, CVD, ALD, physical vapor deposition (PVD), plating, other suitable methods, or combinations thereof.

Figure 5A:
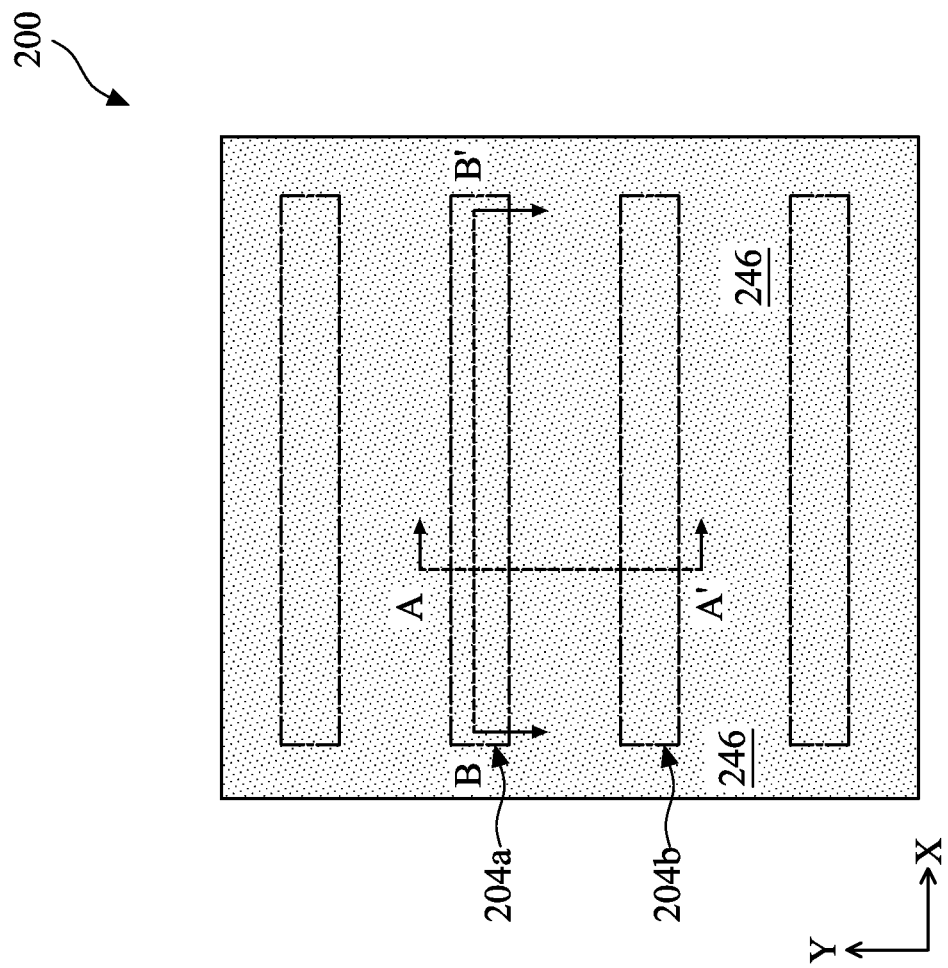
Figure 5C:
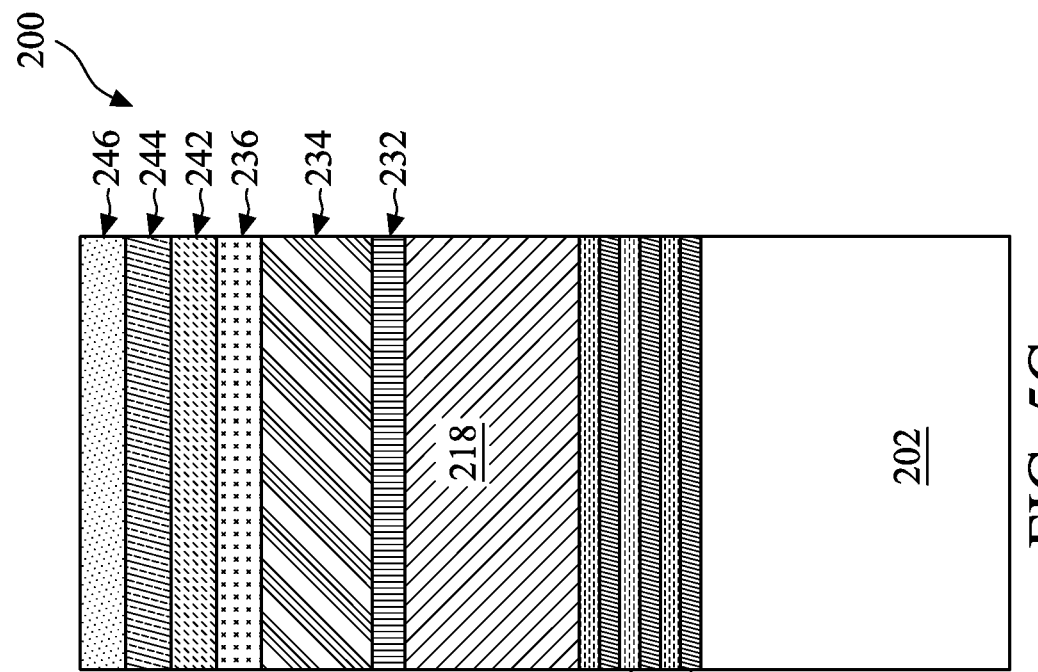
Figure 5B:
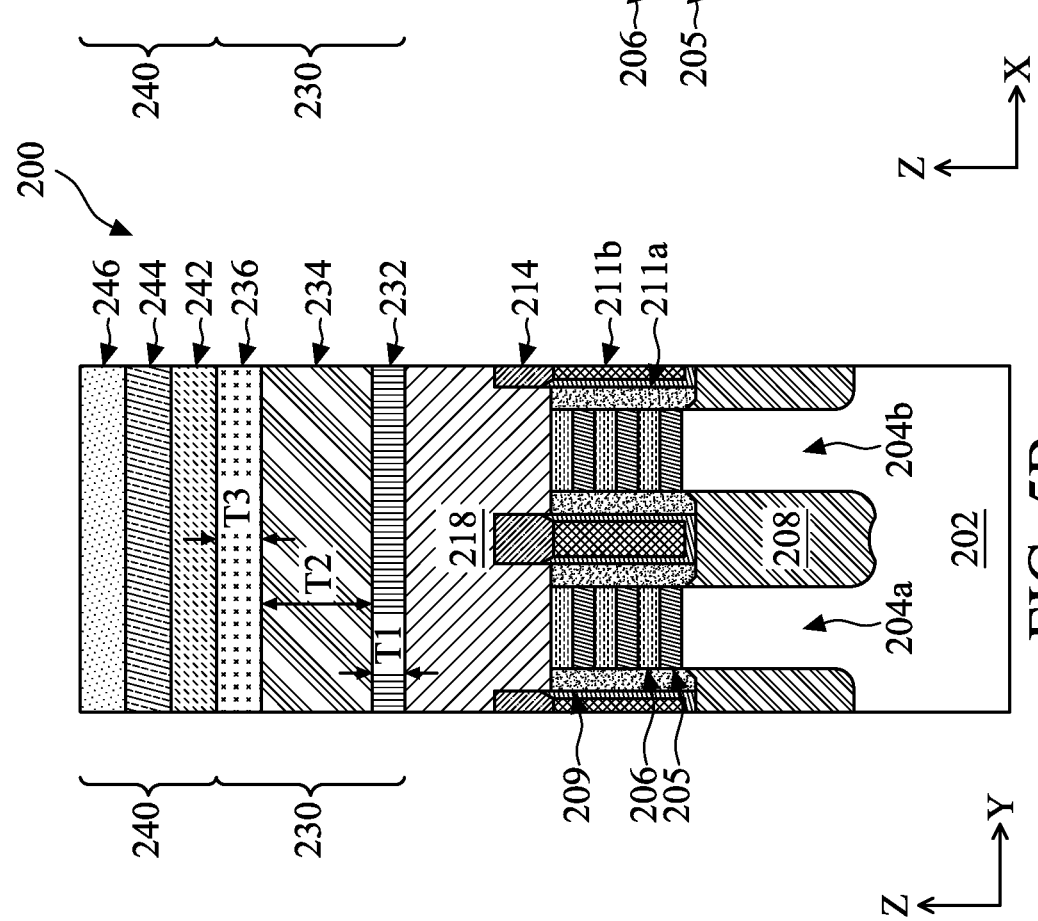
FIGS. 5B and 5D are cross-sectional views of the example semiconductor structure along line AA' as shown in FIG. 5A at intermediate stages of the example method as shown in FIGS. 1A and/or 1B according to some embodiments of the present disclosure.
Figure 5D:
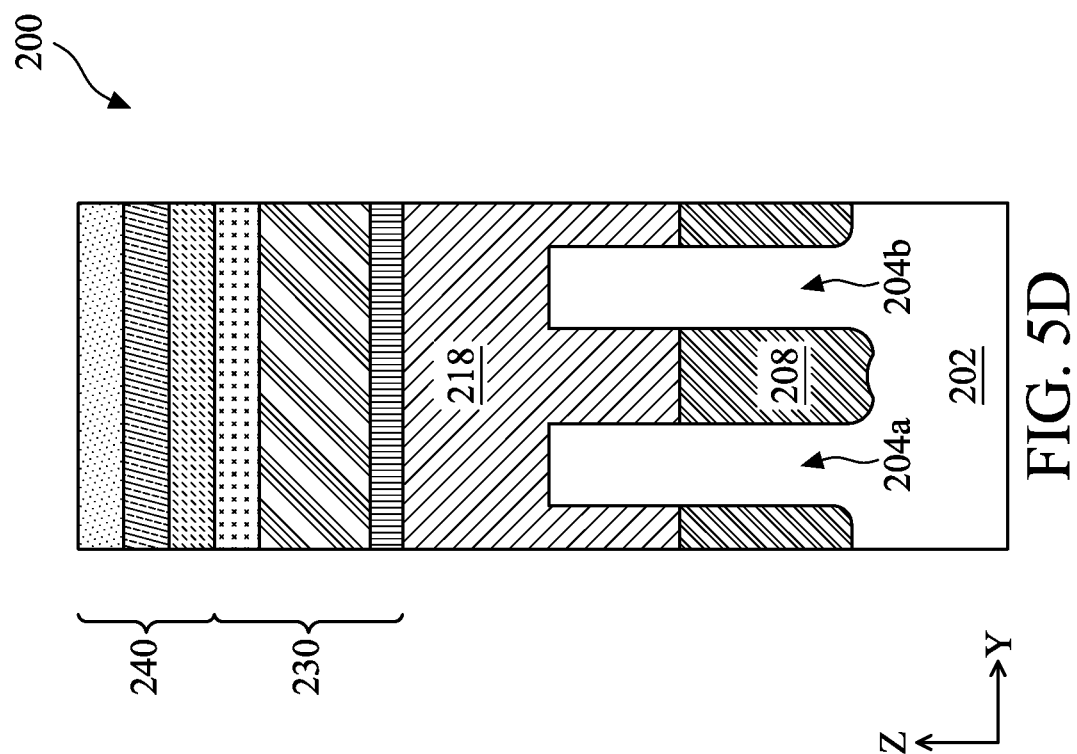

Still referring to FIGS. 1B and 5A-5D, method 150 at operation 154 forms a masking element 240 over the dummy gate layer 218, where the masking element 240 includes a multi-layer structure configured to form a patterned feature using a photolithography process. As will be discussed in detail below, the masking element 240 may be patterned using an extreme ultraviolet lithography (EUVL) process. In the present embodiments, to accommodate the patterning process and protect the dummy gate layer 218 during subsequent fabrication processes, a hard mask (HM) element 230, which includes a multi-layer structure, is first formed over the dummy gate layer 218 before forming the masking element 240. FIG. 5D illustrates an embodiment similar to that of FIG. 5B, except that the fins 204*a* and 204*b* in FIG. 5D each include a single semiconductor layer (corresponding to the embodiment of FIG. 2D) rather than an ML as is depicted in FIG. 5B.

In some embodiments, the HM element 230 includes a bottom HM 232 over the dummy gate layer 218, a middle HM 234 over the bottom HM 232, and a top HM 236 over the middle HM 234. In the present embodiments, the bottom HM 232 includes a nitride material, such as SiN, the middle HM 234 includes an oxide material, such as SiO and/or SiO$_2$, and the top HM 236 includes a nitride material, such as SiN. In some embodiments, the layers of the HM element 230 differ in thickness. In one non-limiting example, a thickness T1 of the bottom HM 232 is less than a thickness T3 of the top HM 236, which is less than a thickness T2 of the middle HM 234.

In some embodiments, the masking element 240 includes a bottom layer 242, a middle layer 244 over the bottom layer 242, and a photoresist (PR) layer 246 over the middle layer 244. In some embodiments, the bottom layer 242 is a bottom anti-reflective coating (BARC) material whose composition is chosen to minimize reflectivity of a radiation source implemented during exposure of the PR layer 246. The bottom layer 242 may be a polymer-containing layer. In some embodiments, the middle layer 244 includes a composition that provides anti-reflective properties and/or hard mask properties for the subsequently implemented photolithography process (e.g., the EUVL process). Each of the bottom layer 242 and the middle layer 244 may include a single-layer structure or a multi-layer structure and may be formed by any suitable process, such as a spin-coating process.

In the present embodiments, the PR layer 246 is a photosensitive layer operable to be patterned by a photolithography process, which initiates a series of photochemical reactions in the PR layer 246. The PR layer 246 may include any suitable photosensitive resist material, and in many embodiments, the PR layer 246 includes a resist material sensitive to a radiation source (e.g., EUV radiation, UV radiation, and/or deep ultraviolet (DUV) radiation). However, the principles of the present disclosure apply equally to e-beam resists and other direct-write resist materials. In the present embodiments, the PR layer 246 is configured to be patterned by EUV radiation. In some embodiments, regions of the PR layer 246 exposed to the radiation source undergo chemical reactions such that they decompose and become more soluble in a developing solution (i.e., the PR layer 246 undergoes a positive-tone development process). In some embodiments, exposed regions of the PR layer 246 undergo chemical reactions such that they polymerize and/or cross-link and become less soluble in a developing solution (i.e., the PR layer 246 undergoes a negative-tone development process).

Referring to FIGS. 1B and 6A-6C, method 150 at operation 156 performs a photolithography process to pattern the PR layer 246. In the present embodiments, performing the photolithography process includes first exposing the PR layer 246 to a radiation source via a photomask. In some embodiments, the radiation source is an EUV radiation (having a wavelength of about 1 nm and about 100 nm, e.g., about 13.5 nm), a DUV radiation such as KrF excimer laser (having a wavelength of about 248 nm) or ArF excimer laser (having a wavelength of about 193 nm), an I-line radiation (having a wavelength of about 365 nm), an x-ray, an e-beam, an ion beam, other suitable radiations, or combinations thereof. The exposure process at operation 156 may be performed in air, in a liquid (immersion lithography), or in vacuum (e.g., for EUVL and e-beam lithography). The photomask used during the exposure process may be a transmissive mask or a reflective mask, the latter of which may further implement resolution enhancement techniques such as phase-shifting, off-axis illumination (OAI) and/or optical proximity correction (OPC). In some embodiments, the radiation source is directly modulated with a predefined pattern, such as an IC layout, without using a masking element (such as using a digital pattern generator or direct-write mode). In the present embodiments, the radiation source implemented at operation 156 is a EUV radiation and the exposure process is performed in a EUVL system. Correspondingly, a reflective photomask may be used to pattern the PR layer 246.

Subsequently, still referring to FIGS. 6A-6C, method 150 at operation 156 then develops the exposed PR layer 246 to form a patterned PR layer 246 that includes structures 246a-246d. After performing the exposure process, exposed regions of the PR layer 246 undergo a series of photochemical reactions while unexposed regions of the PR layer 246 remain substantially unchanged, resulting in differences in solubility in a developing solution between the exposed regions and the unexposed regions of the PR layer 246. The developing process at operation 156 dissolves or otherwise removes either the exposed regions in the case of a positive-tone development process or the unexposed regions in the case of a negative-tone development process. The developing process may begin with a post-exposure baking process. Depending on the polymer(s) included in the PR layer 246, the post-exposure baking process may catalyze a reaction between a photoacid generated by the exposure process and polymer included in the PR layer 246. For example, the post-exposure baking process may accelerate cleaving (for a positive-tone PR) or cross-linking (for a negative-tone PR) of the polymer caused by the photoacid. Following the optional post-exposure baking process, a developing solution (or a developer) is applied to the structure 200, thereby removing the desired regions of the PR layer 246. Positive-tone developers may include, but are not limited to, tetramethyl ammonium hydroxide (TMAH), KOH, NaOH, and/or other suitable solvents, and negative-tone developers may include, but are not limited to, n-butyl acetate, ethanol, hexane, benzene, toluene, and/or other suitable solvents. In some embodiments, method 150 performs an additional baking process after the developing process at operation 156 to further stabilize the patterned PR layer 246.

Figure 6A:
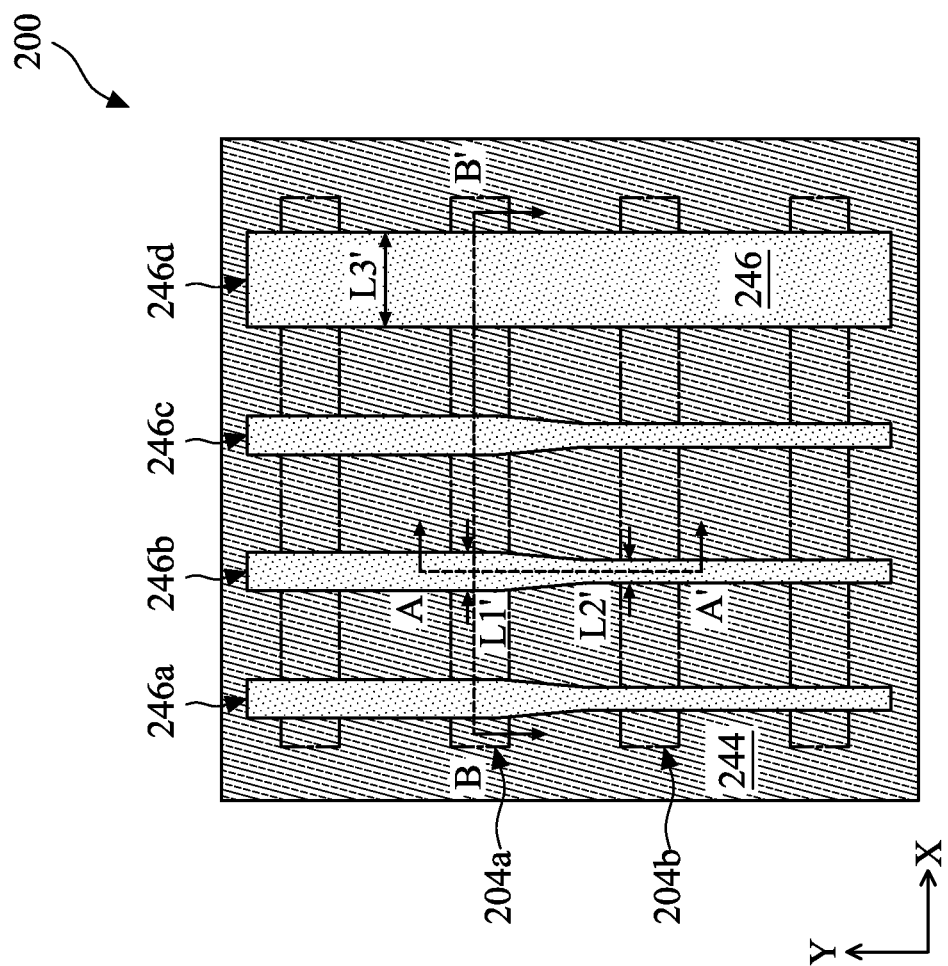

In the present embodiments, referring to FIG. 6A, a gate length of each structure 246a, 246b, and 246c of the patterned PR layer 246 varies along the Y axis. For example, a portion of each structure 246a-246c formed over the fin 204a has a gate length L1', and a portion of each structure 246a-246c formed over the fin 204b has a gate length L2', where L1' is greater than L2' and where each structure 246a-246c are configured with a continuous profile transitioning between the two gate lengths. Furthermore, structure 246d is formed to a uniform gate length L3' along the Y axis, where L3' may be different from L1' and/or L2'. Though the present embodiments are not limited to the configurations depicted herein, the patterned PR layer 246 includes at least one of the structures 246a-246c, which is each defined by varying gate lengths, and may include more or less of the structure 246d, which is defined by a uniform gate length. As the patterned PR layer 246 is subsequently used to etch the dummy gate layer 218, the resulting dummy gate structure 250 have a profile that is similar, though not identical, to that of the structure 246a-246d.

Thereafter, though not depicted, method 150 at operation 158 patterns the remainder of the masking element 240 using the patterned PR layer 246 as an etch mask. In some embodiments, the remainder of the masking element 240 is patterned using one or more suitable etching processes to remove portions of the middle layer 244 and the bottom layer 242 exposed by the patterned PR layer 246.

Figure 7A:
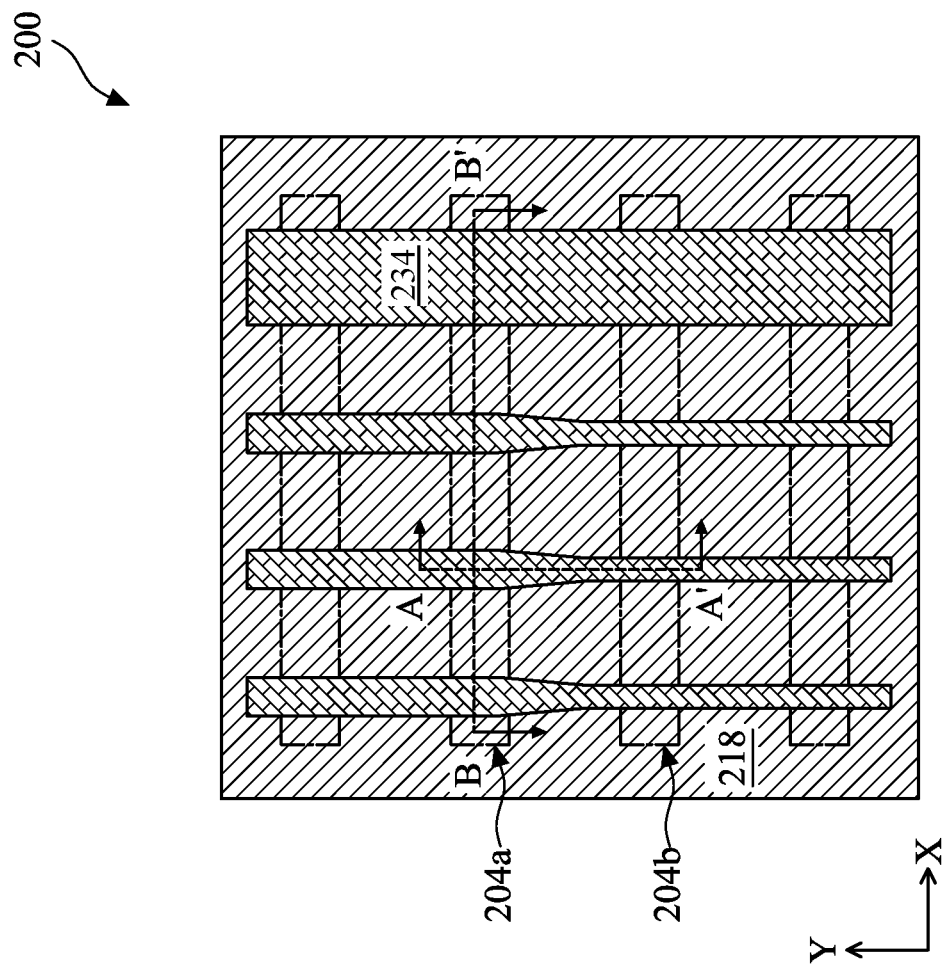
Figures 7B, 7C:
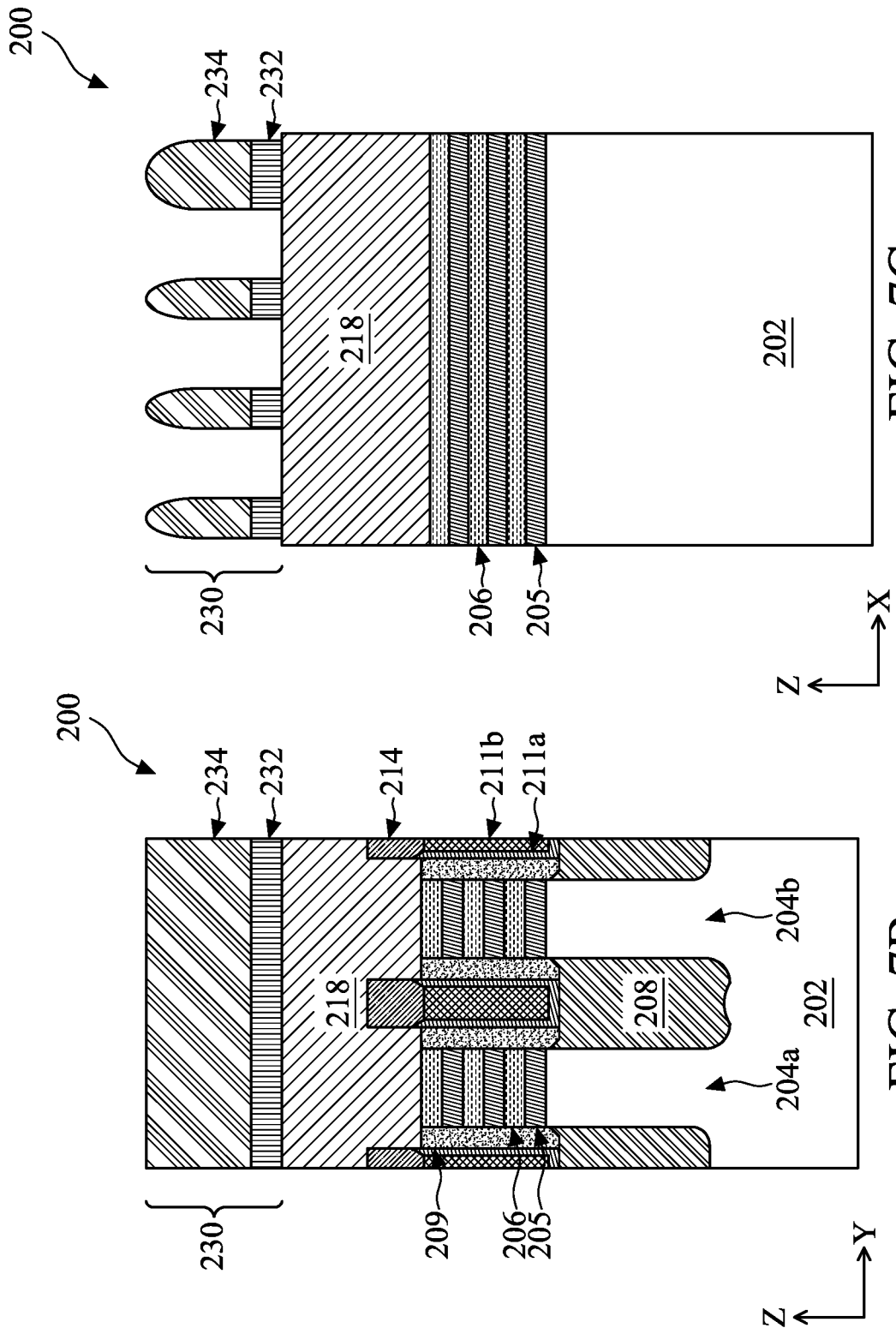

Referring to FIGS. 1B and 7A-7C, method 150 at operation 160 patterns the HM element 230 using the patterned masking element 240 as an etch mask. Method 150 may pattern the HM element 230 in one or more etching processes that include a dry etching, a wet etching, an RIE process, or combinations thereof. Due to differences in composition, various layers of the HM element 230 may be etched separately using different etchants. For example, the top HM 236 and the bottom HM 232 may be etched using hydrofluoric acid (HF), while the middle HM 234 may be etched using phosphoric acid ($H_3PO_4$). After patterning the HM element 230, the patterned masking element 240 is removed from the structure 200 by any suitable method, such as resist stripping and/or plasma ashing. In some embodiments, patterning the HM element 230 and/or subsequently removing the patterned masking element 240 results in top portions of the HM element 230 to have a rounded profile as depicted in FIG. 7C. In some embodiments, as depicted herein, the top HM 236 is removed altogether after patterning the HM element 230.

Subsequently, referring to FIGS. 1B and 8A-8C, method 150 at operation 162 patterns the dummy gate layer 218 using the patterned HM element 230 as an etch mask, resulting in the dummy gate structure 250. Method 150 may implement a dry etching process, a wet etching process, an RIE process, or combinations thereof to pattern the dummy gate layer 218. In some embodiments, the etchant implemented at operation 162 differs from those implemented at operations 156, 158, and/or 160.

In existing implementations, patterning the dummy gate layer 218 to form the dummy gate structure 250 utilizes multiple patterning process, such as a self-aligned double patterning (SADP) process. However, in order to form dummy gate stacks with different gate lengths and a continuous profile, additional patterning process is required after performing the multiple patterning process. Utilizing an EUVL process to transfer the pattern from a PR layer (e.g., the PR layer 246) to a dummy gate layer (e.g., the dummy gate layer 218) without undergoing multiple patterning process reduces the overall cost and complexity associated with the patterning process. In addition, owing to its shorter wavelength the EUVL process may also enable smaller feature sizes to be fabricated, which may be desirable for advanced technology nodes.

Figure 8A:
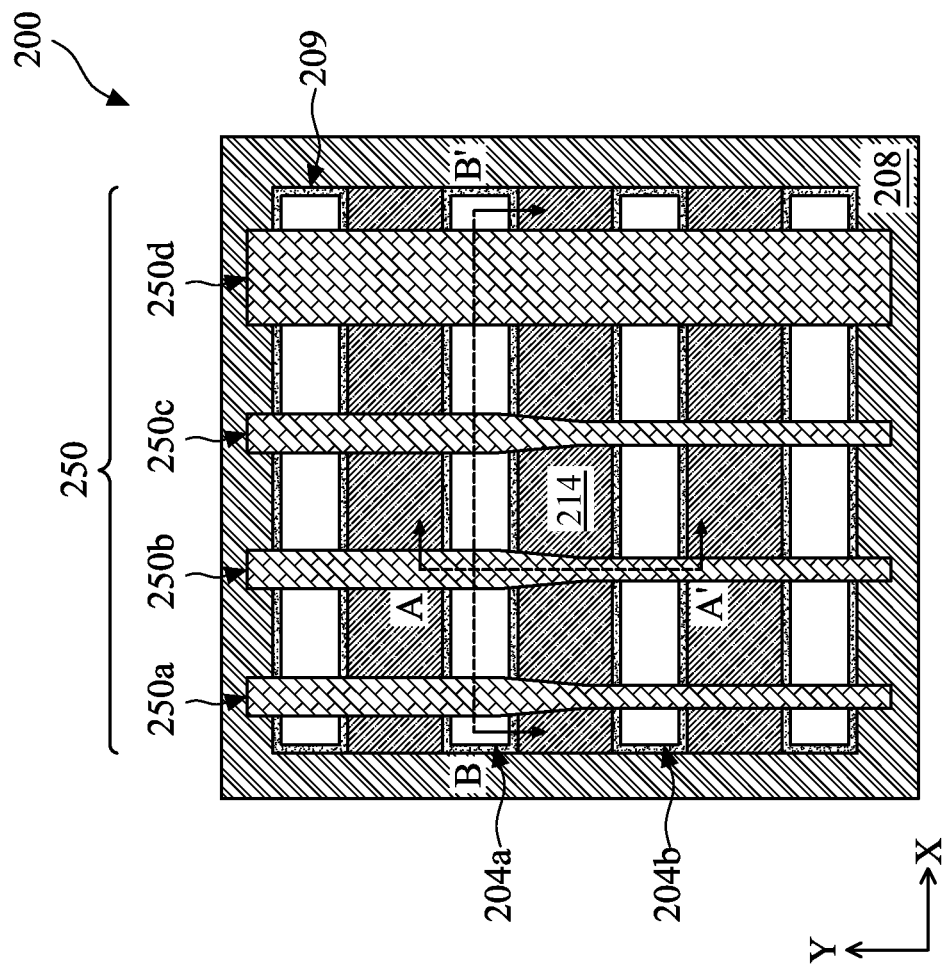

In some embodiments, as depicted in FIGS. 8A-8C, the HMs 232 and 234 remain over the structure 200 to protect the underlying dummy gate structure 250 and are removed during subsequent operations of method 100. However, for purposes of clarity and simplicity, the dummy gate structure 250 is depicted without the presence of the HMs 232 and 234 in subsequent figures.

Figure 9A:
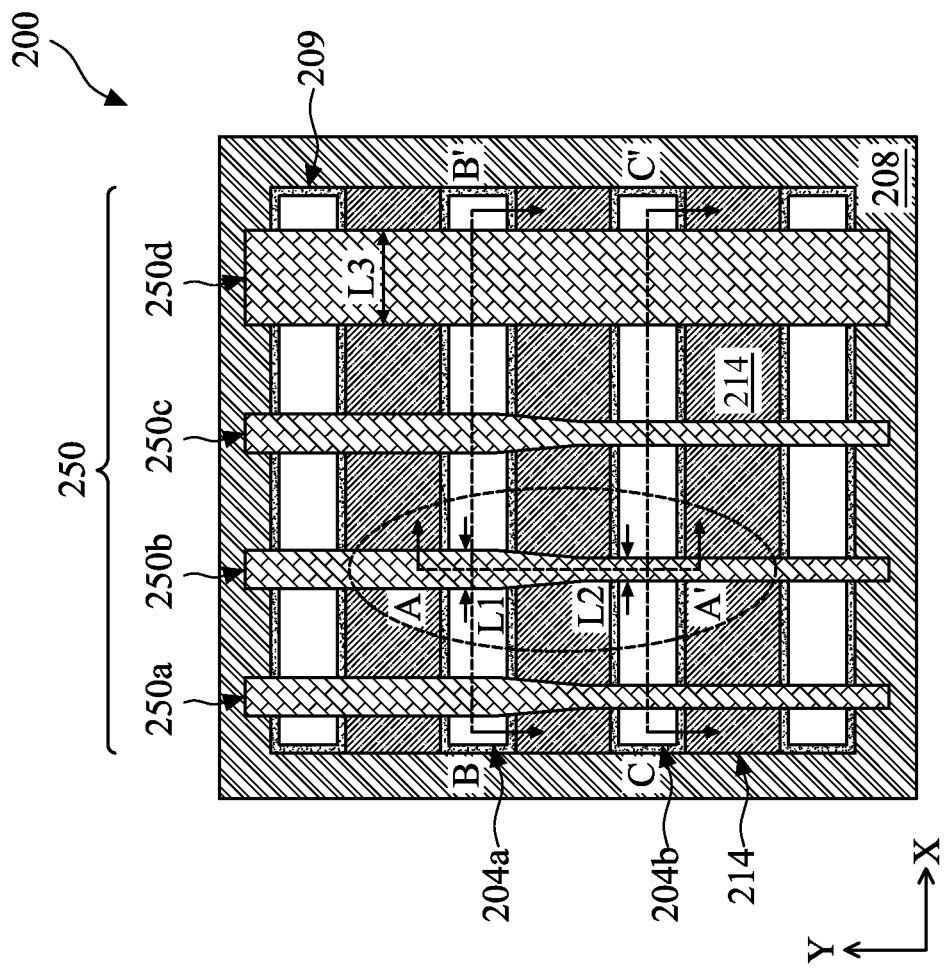

The dummy gate structure 250 is discussed in detail in FIGS. 9A-9F. Referring to FIG. 9A, which is a planar top view of the structure 200, the dummy gate structure 250 includes dummy gate stacks 250a, 250b, 250c, and 250d oriented lengthwise along the Y axis and spaced from each other along the X axis. In the present embodiments, one or more of the dummy gate stacks 250a-250c are defined by a gate length (i.e., width measured along the X axis) that varies along the Y axis. As will be discussed in detail below, the change in the gate length of each dummy gate stack 250a-250c along the Y axis, alternatively referred to as a jog structure, affords flexibility in designing metal gate stacks having regions of different threshold voltages for purposes of adjusting various device parameters at reduced length-scales.

Figure 9C:
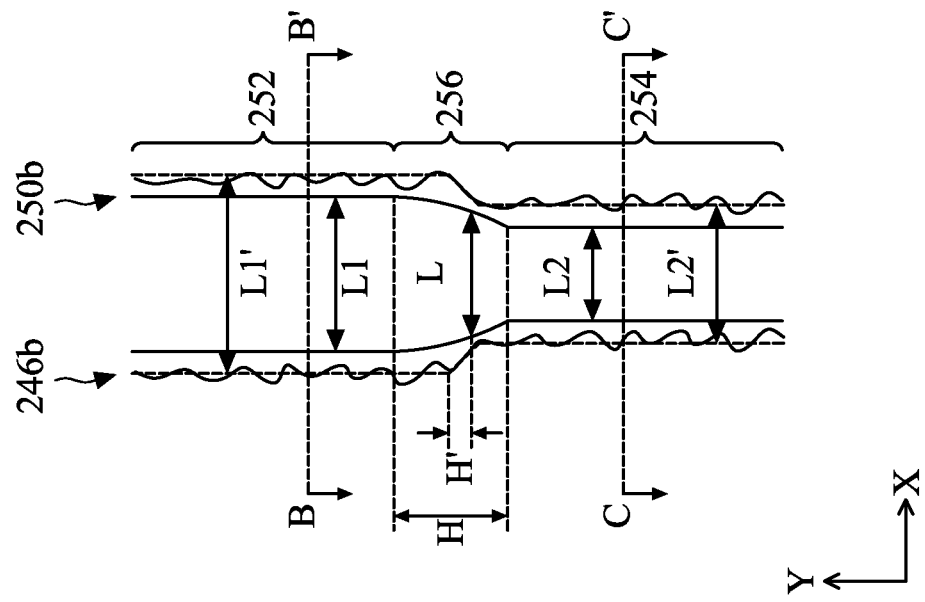
Figure 9B:
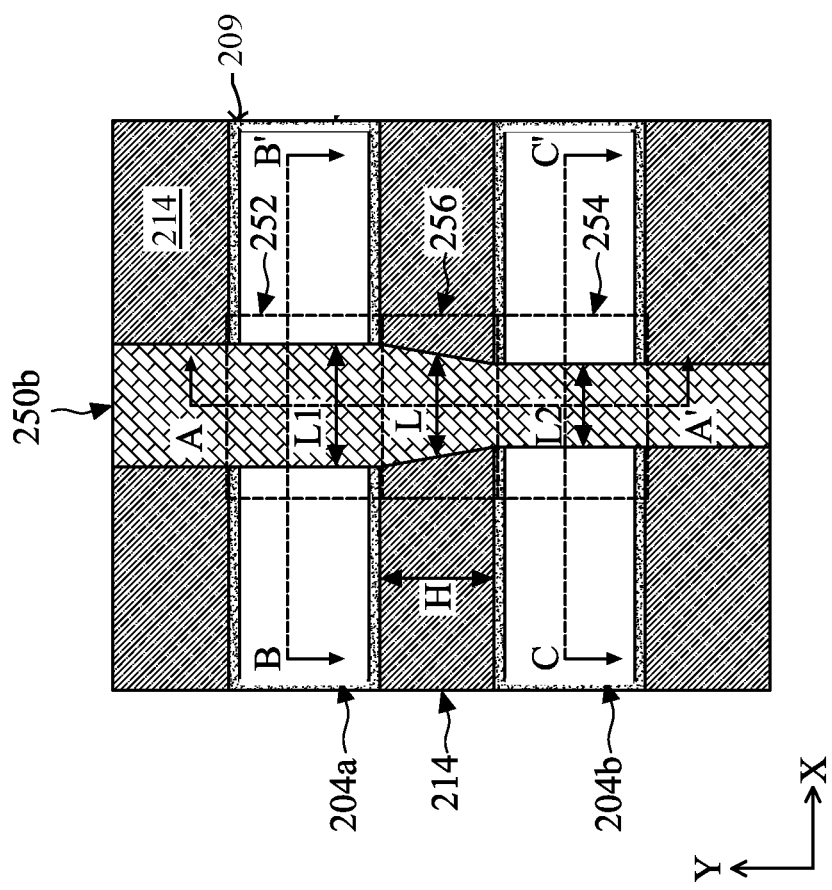
Figure 9D:
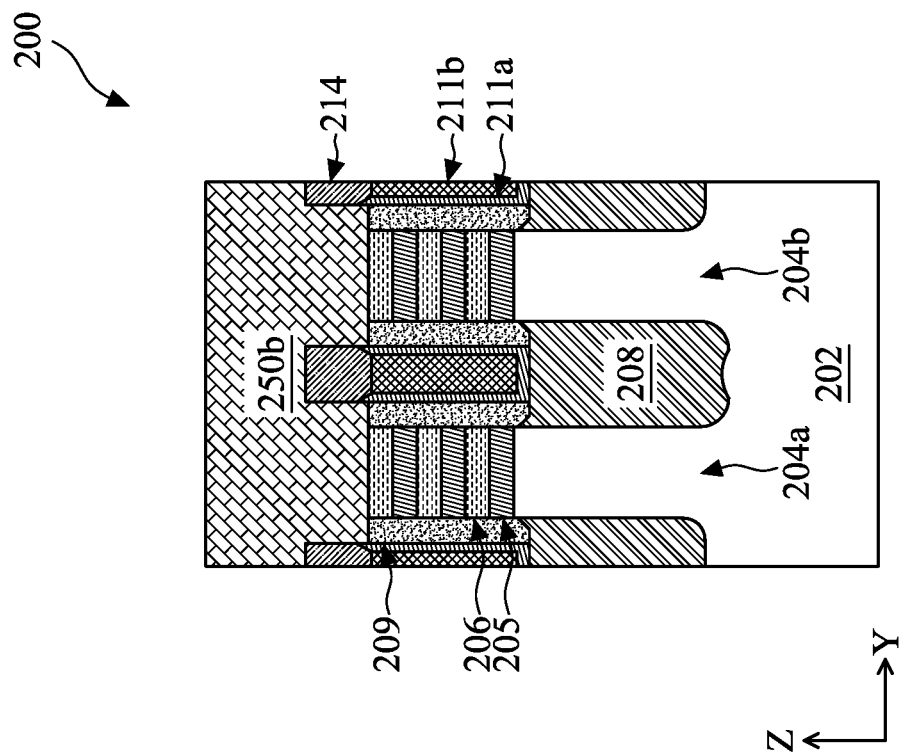
FIGS. 9D, 10A, and 11A are cross-sectional views of the example semiconductor structure along line AA' as shown in FIG. 9A at intermediate stages of the example method as shown in FIGS. 1A and/or 1B according to some embodiments of the present disclosure.

Referring to FIG. 9B, which is an enlarged view of a portion of the dummy gate stack 250b in the dashed circle, the dummy gate stack 250b includes a region 252 formed over the fin 204a and defined by a gate length L1, a region 254 formed over the fin 204b and defined by a gate length L2 that is less than the gate length L1, and a region 256 formed over the dielectric helmet 214 to connect the region 252 with the region 254. The dummy gate stack 250d, corresponding to the structure 246d depicted in FIG. 6A, is defined by a gate length L3 that differs from the gate lengths L1 and L2 and does not vary along the Y axis. A cross-sectional view of the structure 200 through the dummy gate stack 250b along the Y axis is shown in FIG. 9D; a cross-sectional view of the structure 200 across the region 252 along the X axis is shown in FIG. 9E; and a cross-sectional view of the structure 200 across the region 254 along the X axis is shown in FIG. 9F.

In the present embodiments, the region 256 is a transitional region configured with a continuous profile between the regions 252 and 254, where a height H of the region 256 along the Y axis is at least as large as the separation distance S (see FIG. 2B, for example) between the two adjacent fins 204a and 204b. In this regard, the height H may be as large as a width of the dielectric helmet 214 measured between the fins 204a and 204b (i.e., along the Y axis). In some embodiments, the height H is less than the width of the dielectric helmet 214 between the fins 204a and 204b. In the present embodiments, a width W of the region 256 measured along the X axis continuously decreases when transitioning from the region 252 towards the region 254.

In some embodiments, as depicted in FIG. 9B, the continuous profile of the region 256 is configured as an inverted trapezoid, where the transition between the regions 252 and 256 and between the regions 256 and 254 includes sharp corners. In other words, a top surface of the trapezoid, which is defined by the gate length L1, is longer than a bottom surface of the trapezoid, which is defined by the gate length L2, and the two sides connecting the top and the bottom surfaces are substantially slanted and straight surfaces. In some embodiments, in a profile of a planar top view of the gate stack 250b (smooth curves) depicted in FIG. 9C, the continuous profile of the region 256 is configured such that the transition between the regions 252 and 256 and between the regions 256 and 254 includes rounded corners rather than sharp corners.

In the present embodiments, referring to FIGS. 9B and 9C collectively, the gate lengths L1 and L2 are determined based on specific design requirements for optimizing performance parameters such as leakage or enhanced processing speed for different device regions. In some embodiments, each of the gate lengths L1 and L2 is about 8 nm to about 13 nm, and a difference $\Delta L$ between them (i.e., $\Delta L = L1 - L2$) is at least about 0.5 nm to about 5 nm. In some embodiments, the height H of the region 256 varies as a function of the difference $\Delta L$. For example, as the difference $\Delta L$ increases, the height H also increases, thereby lengthening the region 256 along the Y axis. In other words, a larger difference $\Delta L$ results in a larger separation distance between the adjacent fins 204a and 204b. Therefore, in an effort to reduce the size of active device regions (e.g., an SRAM cell or logic cell), it may be desirable to minimize the difference $\Delta L$ within the tolerance of the specific design requirements. In the present embodiments, a difference $\Delta L$ exceeding about 5 nm may result in an excessive amount of lengthening beyond the tolerance of the specific design requirements, and a difference $\Delta L$ of less than about 0.5 nm may not be enough for the benefits (discussed in detail below) resulting from such difference to be realized. In some embodiments, an increase in the difference $\Delta L$ by about 1 nm results in an increase in the height H by about 0.2 nm to about 1.5 nm, where such range of the height H is attributed to the capabilities afforded by the photolithography and etching processes. Accordingly, the separation distance S between the fins 204a and 204b as discussed above may be adjusted based on the knowledge of the height H.

Also shown in FIG. 9C is profile of the structure 246b (corrugated curves; see FIG. 6A) in a planar top view after patterning the PR layer 246 at operation 156, where a transitional region of the structure 246b (corresponding to the region 256 of the profile of the dummy gate stack 250b) is defined by a height H'. In some embodiments, roughness of the profile (described by parameters such as line-width roughness, or LWR) of the dummy gate stack 250b is less than that of the profile of the structure 246b. Such reduction in roughness may be accomplished by optimizing compositions and/or thicknesses of the middle layer 244, the bottom layer 242, and/or various layers in the HM element 230. In some instances, smoothing of the profile of the dummy gate stack 250b as a result of etching the dummy gate layer 218 may lead to a lengthening of the region 256 along the Y axis, i.e., the height H is greater than the height H', and a narrowing of the gate length (in both regions 252 and 254) of the gate stack 250b, i.e., the gate lengths L1 and L2 of the profile of the dummy gate stack 250b are less than widths L1' and L2' (see FIG. 6A), respectively, of the profile of the structure 246b taken through an average line width (shown in dashed lines). In the present embodiments, differences between the heights H and H', between the widths L1' and L1, and between the gate length L2' and L2 reflect capabilities of the photolithography and etching processes (e.g., operations 156-162) to resolve minimum feature sizes (e.g., critical dimensions, or CDs) of the dummy gate structure 250. In this regard, the height H may be determined based on such lengthening effect as well as the desired difference $\Delta L$ as discussed above, and the separation distance S may subsequently be determined to be at least the same as the height H. In some examples, the separation distance S may be about 20 nm to about 100 nm.

In some examples, techniques such as OPC may be implemented to compensate for the lengthening of the region 256 (e.g., by increasing the gate length L1 of the region 252 and decreasing the gate length L2 of the region 254 in their respective transitional regions near the region 256). In further examples, factors such as choice of materials used in the PR layer 246, dosage and/or energy of the radiation source (e.g., the EUV source), and choice of etchants for patterning the dummy gate structure 250 may also be used to reduce the lengthening of the region 256 at operation 162.

Figure 10A:
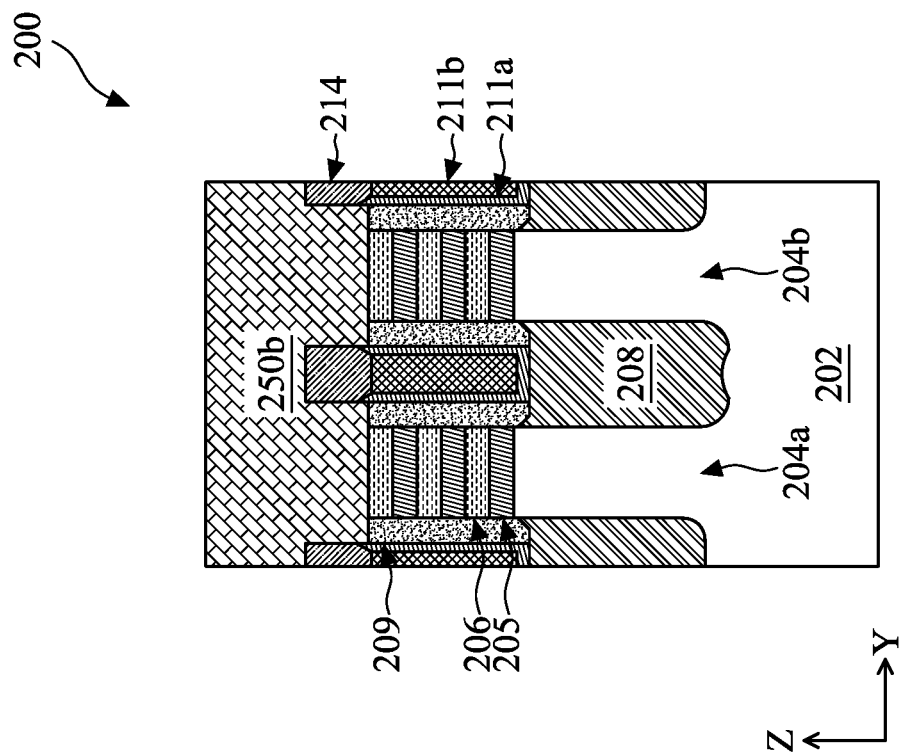
Figure 10C:
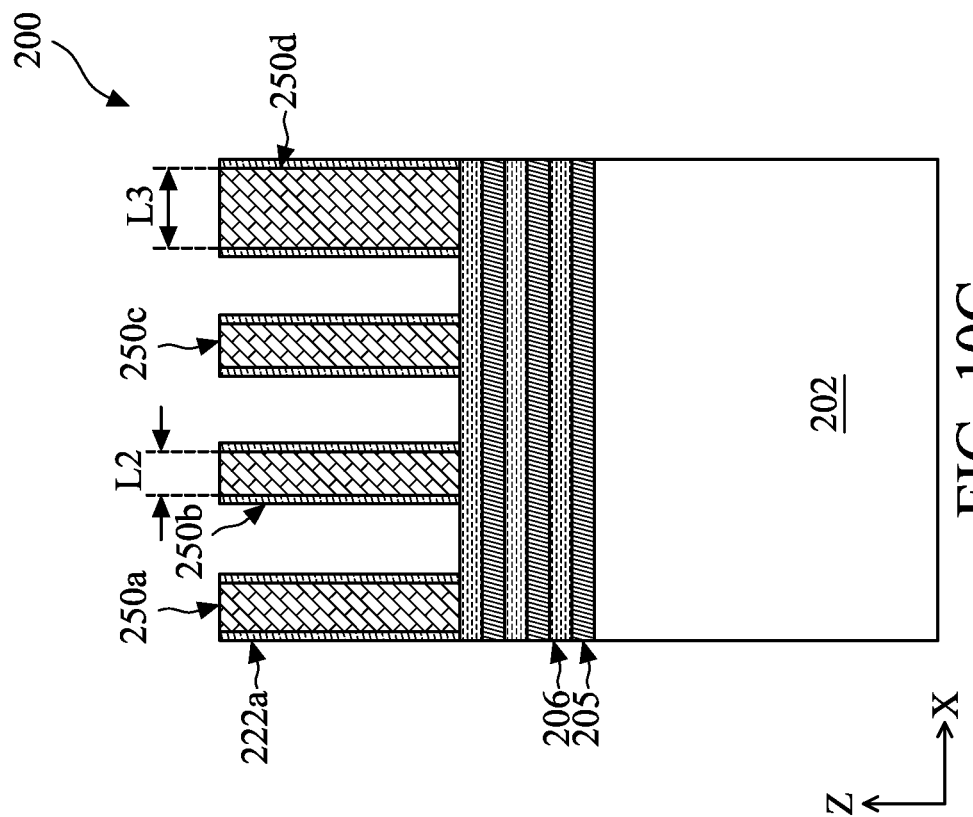
Figure 10B:
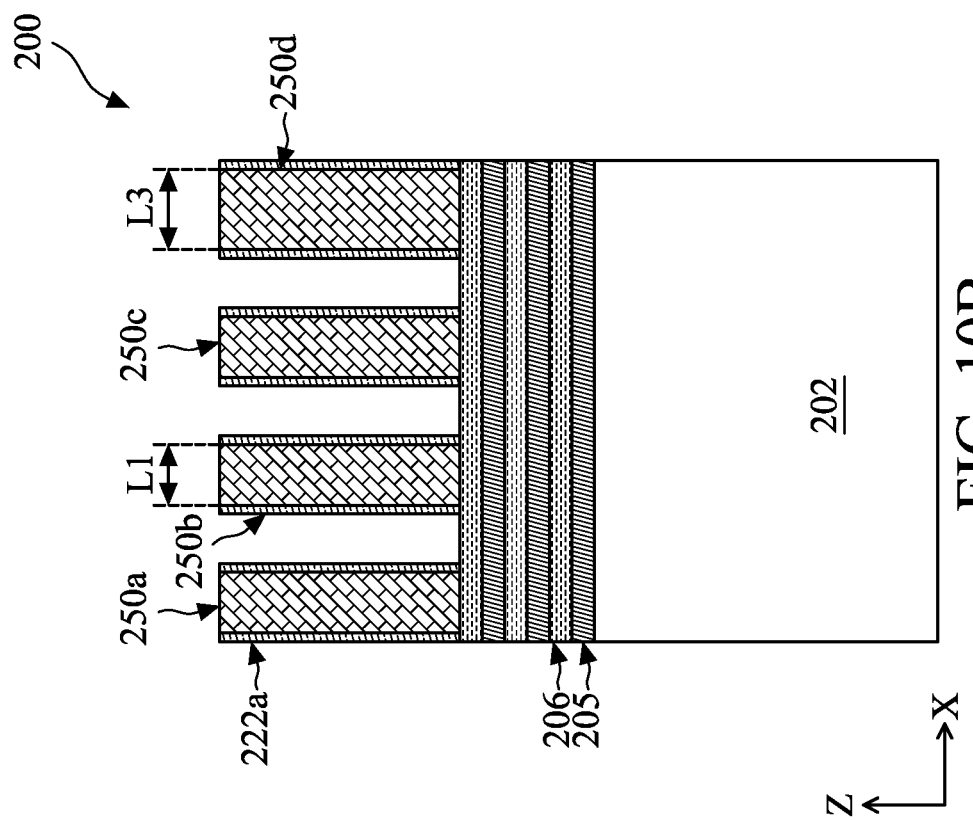

Subsequently, referring to FIG. 10A-10C, method 150 at operation 162 forms top gate spacers 222a on sidewalls of each portion of the dummy gate structure 250. The top gate spacers 222a may include a single-layer structure or a multi-layer structure and may include SiO and/or SiO$_2$, SiN, SiC, SiON, SiOC, SiCN, air, a low-k dielectric material, a high-k dielectric material (e.g., hafnium oxide (HfO$_2$), lanthanum oxide (La$_2$O$_3$), etc.), other suitable materials, or combinations thereof. Each spacer layer of the top gate spacers 222a may be formed by first depositing a dielectric layer over the dummy gate structure 250 via a suitable deposition method (e.g., CVD and/or ALD) and subsequently removing portions of the dielectric layer in an anisotropic (e.g., directional) etching process (e.g., a dry etching process), leaving the top gate spacers 222a on the sidewalls of each dummy gate structure 250. Thereafter, method 100 completes the formation of the dummy gate structure 250 and proceeds to operation 110 of method 100 as shown in FIG. 1A.

Figure 11A:
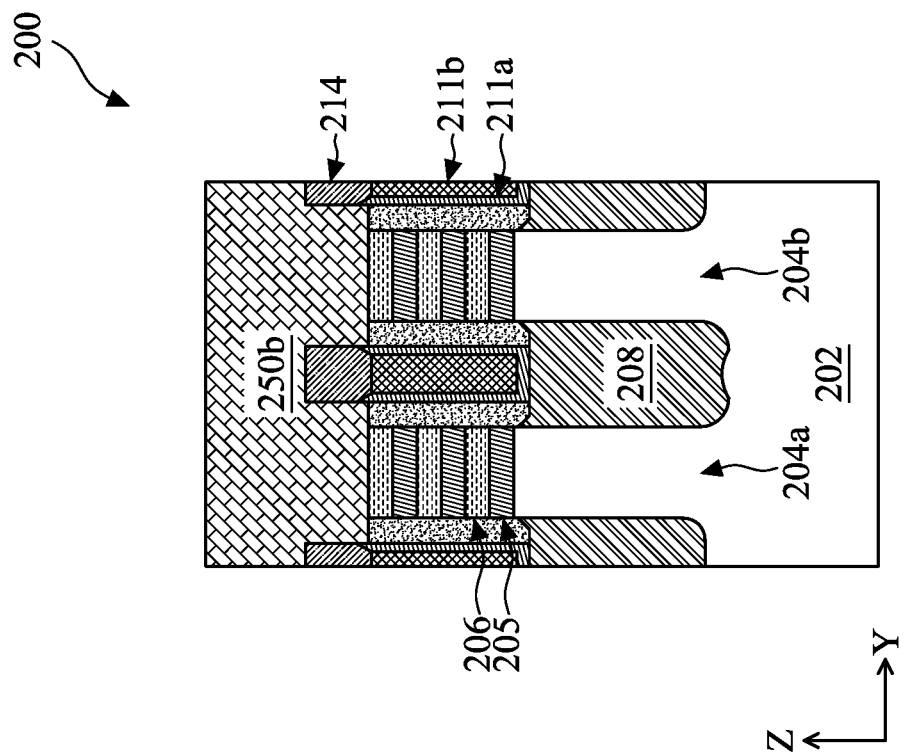

Referring to FIGS. 1A and 11A-11B, method 100 at operation 110 forms epitaxial source/drain (S/D) features 224 in the fins 204a and 204b and adjacent to the dummy gate structure 250. In the present embodiments, method 100 forms the epitaxial S/D features 224 by first forming S/D recesses (not depicted) in the S/D regions of the fins 204a and 204b, forming inner gate spacers 222b on sidewalls of the non-channel layers 205 that are exposed in the S/D recesses, and forming epitaxial S/D features 224 in the S/D recesses.

In the present embodiments, method 100 forms the S/D recesses by implementing an etching process that selectively removes portions of the fins 204a and 204b in the S/D regions. In some embodiments, the etching process is a dry etching process employing a suitable etchant capable of removing the channel layers 206 (e.g., Si) and the non-channel layers 205 (e.g., SiGe) of the ML. A cleaning process may subsequently be performed to clean the S/D recesses with a hydrofluoric acid (HF) solution or other suitable solution.

The inner gate spacers 222b may be a single-layer structure or a multi-layer structure and may include silicon oxide, SiN, SiCN, SiOC, SiON, SiOCN, a low-k dielectric material, air, a high-k dielectric material (e.g., HfO$_2$, La$_2$O$_3$, etc.), other suitable dielectric material, or combination thereof. In some embodiments, the inner gate spacers 222b have a composition different from that of the top gate spacers 222a. Forming the inner gate spacers 222b may include selectively removing portions of the non-channel layers 205 exposed in the S/D recesses without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206, thereby forming the inner gate spacers 222b. The one or more dielectric layers may be deposited by any suitable method, such as ALD, CVD, physical vapor deposition (PVD), other suitable methods, or combinations thereof.

Each of the epitaxial S/D features 224 may be suitable for forming a p-type MOS (PMOS) device (i.e., including a p-type epitaxial material) or, alternatively, an n-type MOS (NMOS) device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 222b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the epitaxial S/D features 224.

Thereafter, still referring to FIGS. 11A-11B, method 100 at operation 110 forms an etch-stop layer (ESL) 258 over the structure 200 to protect the underlying components, such as the epitaxial S/D features 224, during subsequent fabrication processes. The ESL 258 may include any suitable dielectric material, such as SiN, SiCN, Al$_2$O$_3$, other suitable materials, or combinations thereof, and may be formed by CVD, ALD, PVD, other suitable methods, or combinations thereof. In the present embodiments, the ESL 258 provides etching selectivity with respect to its surrounding dielectric components to ensure protection against inadvertent damage to these components. Method 100 then forms an interlayer dielectric (ILD) layer 259 over the ESL 258 to fill the space between portions of the dummy gate structure 250. The ILD layer 259 may include SiO and/or SiO$_2$, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate structure 250.

In some embodiments, method 100 at operation 112 subsequently patterns the dielectric helmet 214, such that some portions of the dielectric helmet 214 remain as gate isolation features for separating the subsequently-formed metal gate structure and other portions of the dielectric helmet 214 are removed from the structure 200. In some embodiments, method 100 patterns the dielectric helmet 214 by forming a patterned masking element (not depicted) to expose portions of the dummy gate structure 250 engaged with portions of the dielectric helmet 214 to be removed. The patterned masking element includes at least a photoresist layer capable of being patterned by a series of photolithography and etching processes discussed in detail above with respect to patterning the fins 204a and 204b. Thereafter, method 100 removes portions of the dummy gate structure 250 exposed by the patterned masking element to expose portions of the dielectric helmet 214 in an etching process (e.g., a dry etching process). In some embodiments, the etching process needs not to completely remove the exposed portions of the dummy gate structure 250, and the extent of such removal is controlled by adjusting the duration of the etching process. After implementing the etching process, the patterned masking element is removed from the structure 200 by any suitable method, such as resist stripping and/or plasma ashing. The exposed portions of the dielectric helmet 214 are then selectively removed with respect to the dummy gate structure 250 in a suitable etching process (e.g., a dry etching process) to form the patterned dielectric helmet 214. In some embodiments, operation 112 is optional and the dielectric helmet 214 is patterned at a subsequent operation. In the depicted embodiments, referring to FIG. 12A, which depicts a metal gate structure 260 after replacing the dummy gate structure 250, a portion of the dielectric helmet 214 under a dummy gate stack 250b is removed, resulting in a continuous (un-cut) metal gate stack 260b, and a portion of the dielectric helmet 214 under the dummy gate stack 250c remains, resulting in a truncated (cut) metal gate stack 260c.

Figures 12A, 12B:
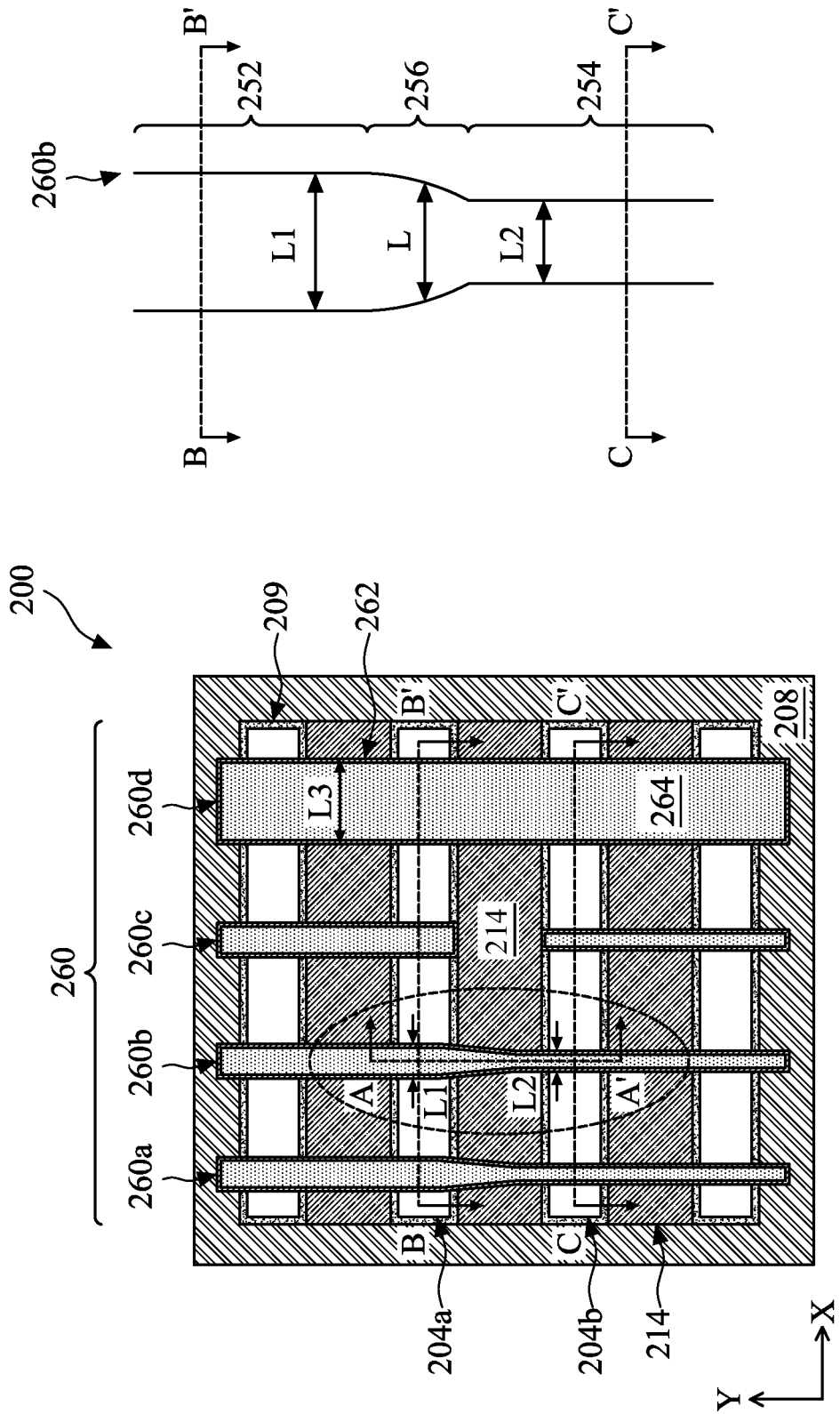

Referring to FIGS. 1A and 12A-12F, method 100 at operation 114 replaces the dummy gate structure 250, the non-channel layers 205, and the cladding layers 209 with the metal gate structure 260, which includes metal gate stacks 260a, 260b, 260c, and 260d that correspond to the dummy gate stacks 250a, 250b, 250c, and 250d, respectively. In the present embodiments, the features of the profile of the dummy gate structure 250 (e.g., the dummy gate stack 250b) discussed in detail above with respect to FIGS. 9A-9F are maintained in the profile of the metal gate structure 260. In other words, the profile of the metal gate stack 260b shown in FIG. 12A is substantially the same as that of the dummy gate stack 250b shown in FIG. 9C. Accordingly, dimensions of the dummy gate structure 250, such as L1, L2, and L3, are employed to describe dimensions of the metal gate structure 260 in subsequent figures and discussion.

Figure 12C:
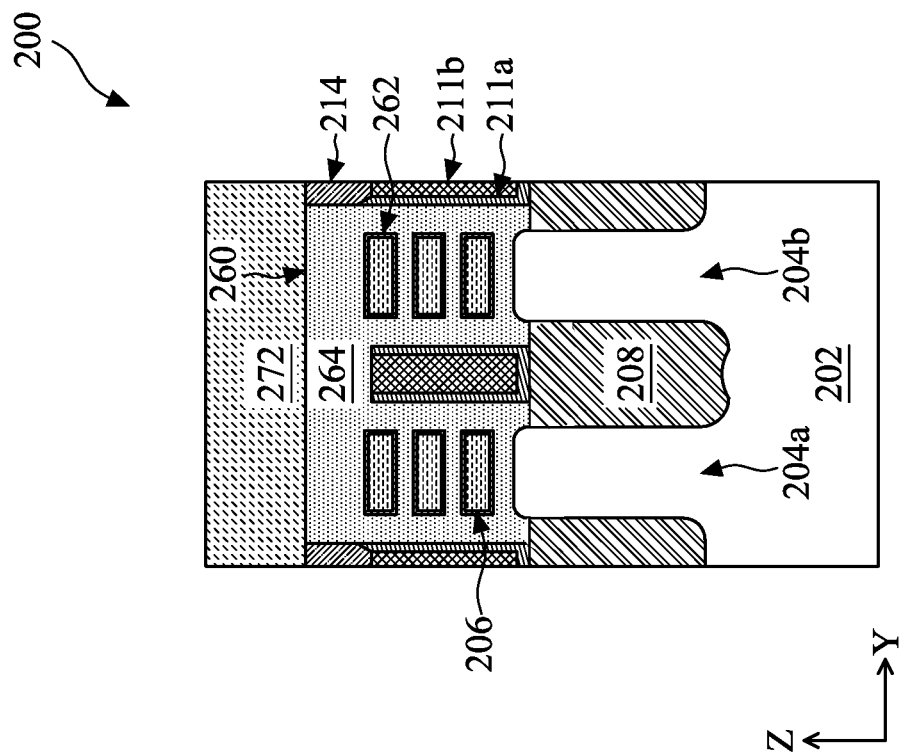

It is noted that FIG. 12A illustrates a planar top view of the structure 200 after implementing operation 114 with dielectric layer 272 (see FIGS. 12C-12G) removed to show the metal gate structure 260 with greater clarity, and FIG. 12B is an enlarged view of a portion of the structure 200 enclosed by dashed circle in FIG. 12A. Furthermore, a cross-sectional view of the structure 200 through the metal gate stack 260b along the Y axis is shown in FIG. 12C; a cross-sectional view of the structure 200 across the region 252 along the X axis is shown in FIG. 12D; an enlarged view of a portion of the region 252 (enclosed by dashed circle in FIG. 12D) is shown in FIG. 12F; a cross-sectional view of the structure 200 across the region 254 along the X axis is shown in FIG. 12E; and an enlarged view of a portion of the region 254 (enclosed by dashed circle in FIG. 12E) is shown in FIG. 12G.

In the present embodiments, method 100 first performs an etching process to remove the dummy gate structure 250 (or remaining portions thereof after patterning the dielectric helmet 214), thereby forming gate trenches (not depicted) between the top gate spacers 222a. The etching process may be a dry etching process, a wet etching process, an RIE process, other suitable processes, or combinations thereof.

Subsequently, for embodiments in which the fins 204a and 204b each include the ML, method 100 removes the cladding layers 209 to form vertical openings (not depicted) along the sidewalls of the channel layers 206 and removes the non-channel layers 205 to form horizontal openings (not depicted) interleaved with the channel layers 206. In some embodiments, method 100 implements separate etching processes to remove the cladding layers 209 and the non-channel layer 205. For example, method 100 may perform a first etching process to remove the cladding layers 209, resulting in vertical openings along the sidewalls of each of the fins 204a and 204b, and then perform a second etching process to remove the non-channel layers 205, resulting in horizontal openings interleaved with the channel layers 206. For embodiments in which the non-channel layers 205 and the cladding layers 209 have the same composition (e.g., SiGe), the first and the second etching processes may be implemented using the same etchant, such as a fluorine-containing etchant including hydrofluoric acid (HF), $F_2$, other fluorine-containing etchants (e.g., $CF_4$, $CHF_3$, $CH_3F$, etc.), or combinations thereof. For embodiments in which each fin 204a and 204b includes a single semiconductor layer, the process of removing the cladding layers 209 and the non-channel layer 205 are omitted.

Still referring to FIGS. 12A-12G, method 100 then forms the metal gate structure 260 in the gate trenches, the vertical openings (if present), and the horizontal openings (if present). Accordingly, for embodiments in which the fins 204a and 204b each include the ML, portions of each of the metal gate stacks 260a-260d wrap around (or interleaved with) each channel layer 206 and extend along the sidewalls of the fins 204a and 204b.

In the present embodiments, referring to FIGS. 12C-12G, the metal gate structure 260 includes a gate dielectric layer 262 and a metal gate electrode 264 disposed over the gate dielectric layer 262. The gate dielectric layer 262 may include a high-k dielectric material, such as $HfO_2$, $La_2O_3$, other suitable materials, or combinations thereof. Referring to FIGS. 12F and 12G particularly, the metal gate electrode 264 includes at least a work function metal (WFM) structure 266 (i.e., WFM structure 266-1 depicted in FIG. 12F and WFM structure 266-2 depicted in FIG. 12G) and a bulk conductive layer 268 disposed over the WFM structure 266. In the present embodiments, the WFM structure 266 includes at least one WFM, which may be a p-type or an n-type WFM. Example WFMs include TiN, TaN, WN, $ZrSi_2$, $MoSi_2$, $TaSi_2$, $NiSi_2$, Ti, TaAl, TaAlC, TiAlN, TaC, TaCN, TaSiN, other suitable work function metals, or combinations thereof. The bulk conductive layer 268 may include Co, W, Ru, Cu, Al, Ti, Ni, Au, Pt, Pd, other suitable materials, or combinations thereof. The metal gate structure 260 may further include other material layers (not depicted), such as an interfacial layer disposed on surfaces of the channel layers 206, a capping layer, a barrier layer, other suitable layers, or combinations thereof. Various layers of the metal gate structure 260 may be formed by various methods including, for example, ALD, CVD, PVD, plating, other suitable methods, or combinations thereof. After forming the bulk conductive layer, one or more CMP processes are performed to remove excessive material formed on top surface of the ILD layer 259, thereby planarizing the structure 200.

In the present embodiments, the metal gate stack 260b engages with the fin 204a and the epitaxial S/D features 224 to form a device D1 (FIG. 12F) and engages with the fin 204b and the epitaxial S/D features 224 to form a device D2 (FIG. 12G). In some examples, the devices D1 and D2 may be of different conductivity types. In some examples, the devices D1 and D2 may be of the same conductivity type but configured with different values of $V_t$.

In the depicted embodiments of FIGS. 12F and 12G, which are examples that do not intend to limit the present embodiments, the WFM structure 266-1 includes WFMs 266a, 266b, 266c, and 266d, while the WFM structure 266-2 includes WFMs 266g, 266h, 266i, and 266j. In some embodiments, WFM structures 266-1 and 266-2 include one or more WFMs of the same composition. In some embodiments, the WFM structures 266-1 and 266-2 include the same number of WFMs. Choices of the WFMs in each of the WFM structures 266-1 and 266-2 are determined based on the desired threshold voltage ($V_t$) for the device D1 formed in the region 252 and the device D2 formed in the region 254, respectively. In the present embodiments, due to the difference in gate lengths (ΔL), a WFM commonly found in both the WFM structures 266-1 and 266-2 presents different values of $V_t$. In other words, different values of $V_t$ may be accomplished using the same WFM in different portions of the same metal gate stack having different gate lengths. In some embodiments, if the tuning of $V_t$ is accomplished by tuning the gate lengths alone, the thicknesses of WFMs of the same composition in different portions of the same metal gate stack are the same.

In existing implementations, adjusting $V_t$ of a metal gate stack is accomplished by changing the WFMs included in the metal gate electrode. With respect to CMOS technology, the NMOS device and the PMOS device are often formed with different WFMs, which generally requires multiple deposition and patterning processes to accomplish. While current methods of forming metal gate stacks with tunable $V_t$ have generally been adequate, they have not been entirely satisfactory in all aspects. For example, as feature sizes (e.g., gate lengths) continue to decrease, forming and patterning multiple WFMs becomes challenging.

The present disclosure provides methods of tuning the $V_t$ of the metal gate stack by varying the gate length of the metal gate stack across different device regions. In the present embodiments, the $V_t$ resulting from a given WFM at a longer gate length (e.g., the gate length L1 of the region 252) is greater than the $V_t$ resulting from the same WFM at a shorter gate length (e.g., the gate length L2 of the region 254). In other words, the $V_t$ of a given WFM may be tuned by changing the gate length of the metal gate stack.

FIGS. 13A and 13B each illustrate a table showing contribution of WFMs to the values of $V_t$ of an NMOS device and its complementary PMOS device. Notations such as $V_{t\_m}$, where m is an integer from 1 to 6, describe different values of $V_t$, and notations such as "WFn," where n is an integer from 1 to 8, describe different compositions of WFMs. Referring to FIG. 13A, the metal gate stack (e.g., the metal gate stacks 260a-260c) for each device has two distinct gate lengths, L1 and L2, arranged in a continuous profile as depicted in the present embodiments. In this regard, a common WFM (e.g., WF3 in the dashed circle) included in portions of the metal gate stack having different gate lengths yields different values of $V_t$. Furthermore, different WFMs (e.g., WF1 and WF2 in the dashed circle) included in portions of the metal gate stack having the same gate length also yield different values of $V_t$. Referring to FIG. 13B, the metal gate stack (e.g., the metal gate stack 260d) is defined by a single gate length L3. In this example, achieving different values of $V_t$ for each of the NMOS and the PMOS requires different WFMs, i.e., each value of $V_t$ corresponds to a different WFM composition. Accordingly, in order to achieve different values of $V_t$, the total number of WFMs needed, and thus the complexity associated with processing such WFMs, is greater for a metal gate stack having a single, uniform gate length than for one having varying gate lengths.

The ability to tune the $V_t$ of different devices (e.g., the devices D1 and D2) by changing the gate lengths in addition to and/or instead of changing the compositions of the WFMs leads to greater flexibility for meeting different design requirements. For example, devices providing lower leakage current may benefit from increased $V_t$ that results from a longer gate length (e.g., the gate length L1 of the device D1), and devices providing higher speed may benefit from decreased $V_t$ that results from a shorter gate length (e.g., the gate length L2 of the device D2). In addition, the use of EUVL for patterning the dummy gate structure 250 (which subsequently defines the metal gate structure 260) to have a continuous profile of varying gate lengths reduces processing complexity as feature sizes continue to scale toward smaller technology nodes.

In some embodiments, referring to FIGS. 12C-12G, method 100 subsequently recesses the metal gate structure 260 to form a trench (not depicted), such that any remaining portions of the dielectric helmet 214 protrude from and separate (or cut) the recessed metal gate structure 260 into multiple portions. Thereafter, method 100 deposits the dielectric layer 272 (omitted from FIG. 12A for purposes of clarity) over the structure 200 to fill the trench. In some embodiments, the dielectric layer 272 is configured to provide self-alignment capability and etching selectivity during subsequent fabrication processes including, for example, patterning the ILD layer 259 to form S/D contact openings (not depicted) over the epitaxial S/D features 224. Accordingly, in the present embodiments, the dielectric layer 272 has a composition different from that of the ILD layer 259. In some embodiments, the dielectric layer 272 includes SiN, SiCN, SiOC, SiON, SiOCN, SiO and/or $SiO_2$, other suitable materials, or combinations thereof. The dielectric layer 272 may be deposited by any suitable method, such as ALD, CVD, PVD, other suitable methods, or combinations thereof. Subsequently, method 100 removes portions of the dielectric layer 272 formed over the ILD layer 259 in one or more CMP process, thereby planarizing the top surface of the structure 200.

Thereafter, method 100 at operation 116 performs additional fabrication processes to the structure 200, such as forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact (not depicted) or a gate contact (not depicted), with a conductive line or interconnect different conductive lines, which are horizontal interconnect features. The ESLs and the ILD layers of the MLI may have substantially same compositions as those discussed above with respect to the ESL 258 and the ILD layer 259, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Different embodiments may provide different benefits, and not all benefits are required for any specific embodiment. The present disclosure provides methods of tuning $V_t$ of a metal gate stack by varying the gate length of the metal gate stack across different device regions. In some embodiments, the metal gate stack includes a first region defined by a first gate length, a second region defined by a second gate length that is less than the first gate length, and a third region that connects the first region to the second region in a continuous manner, where the third region is defined by a gate length that gradually decreases from the first region to the second region. In some embodiments, the continuous profile of the metal gate stack is obtained by performing an EUVL process. In some embodiments, the first region of the metal gate stack engages with an active region to form a device with a higher $V_t$ and the second region of the metal gate stack engages with an adjacent active region to form a device with a lower $V_t$. Methods and structures of the present disclosure may be applicable in three-dimensional devices including FinFETs and NS FETs, for example.

In one aspect, the present disclosure provides a semiconductor structure that includes a first semiconductor fin and a second semiconductor fin disposed over a substrate and adjacent to each other, a metal gate stack disposed over the substrate, and source/drain features disposed in each of the first semiconductor fin and the second semiconductor fin to engage with the metal gate stack. The metal gate stack includes a first region disposed over the first semiconductor fin, a second region disposed over the second semiconductor fin, and a third region connecting the first region to the second region in a continuous profile, where the first region is defined by a first gate length and the second region is defined by a second gate length less than the first gate length.

In another aspect, the present disclosure provides a semiconductor structure that includes a first semiconductor fin and a second semiconductor fin protruding from a substrate, source/drain (S/D) features disposed in each of the first semiconductor fin and the second semiconductor fin, and a metal gate structure disposed over the substrate and between the S/D features. The metal gate structure includes a first portion that engages with the first semiconductor fin to form a first device, a second portion that engages with the second semiconductor fin to form a second device, and a third portion extending from the first portion to the second portion. Furthermore, the first portion is defined by a first dimension, the second portion is defined by a second dimension different from the first dimension, and the third portion is defined by a third dimension that decreases gradually from the first portion to the second portion, where the first dimension, the second dimension, and the third dimension are measured along a lengthwise direction of the first semiconductor fin and the second semiconductor fin.

In yet another aspect, the present disclosure provides a method that includes forming a first fin and a second fin over a semiconductor substrate, forming a placeholder gate stack over the first fin and the second fin, forming source/drain features in the first fin and the second fin adjacent to the placeholder gate stack, and replacing the placeholder gate stack with a metal gate stack adjacent to the source/drain features. Forming the placeholder gate stack further includes forming a gate layer over the semiconductor substrate, forming a masking element over the gate layer, performing a photolithography process to pattern the masking element, where the patterned masking element is defined by a first profile in a top view, and etching the gate layer to form the placeholder gate stack using the patterned masking element as an etch mask, resulting in the placeholder gate stack being defined by a second profile in the top view that is is different from the first profile, where the second profile includes a first region defined by a first gate length, a second region defined by a second gate length different from the first gate length, and a third region continuously extending from the first region to the second region over a vertical distance H.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first semiconductor fin disposed over a substrate;
a second semiconductor fin disposed over the substrate and adjacent to the first semiconductor fin;
a metal gate stack disposed over the substrate,
wherein the metal gate stack includes a first region, a second region, and a third region,
wherein the first region is disposed over the first semiconductor fin, the second region is disposed over the second semiconductor fin, and the third region connects the first region to the second region in a continuous profile, and, wherein, the third region has a profile defined by an inverted trapezoid when viewed in a top view, and
wherein the first region is defined by a first gate length and the second region is defined by a second gate length less than the first gate length; and
source/drain features disposed in each of the first semiconductor fin and the second semiconductor fin to engage with the metal gate stack.

2. The semiconductor structure of claim 1, wherein each of the first semiconductor fin and the second semiconductor fin includes a stack of semiconductor layers, and wherein a portion of the metal gate stack is interleaved with each stack of semiconductor layers.

3. The semiconductor structure of claim 2, further comprising a dielectric helmet disposed between the first semiconductor fin and the second semiconductor fin, wherein the dielectric helmet protrudes from the first semiconductor fin and the second semiconductor fin, and wherein the third region is disposed over the dielectric helmet.

4. The semiconductor structure of claim 1, wherein the third region is defined by a third gate length that continuously decreases from the first region to the second region.

5. The semiconductor structure of claim 1, wherein a difference between the first gate length and the second gate length is 0.5 nm to 5 nm.

6. A semiconductor structure, comprising:
a first semiconductor fin and a second semiconductor fin protruding from a substrate;
source/drain (S/D) features disposed in each of the first semiconductor fin and the second semiconductor fin; and
a metal gate structure disposed over the substrate and between the S/D features,
wherein the metal gate structure includes a first portion, a second portion, and a third portion extending from the first portion to the second portion,
wherein the first portion engages with the first semiconductor fin to form a first device and the second portion engages with the second semiconductor fin to form a second device, and
wherein the first portion is defined by a first dimension, the second portion is defined by a second dimension different from the first dimension, and the third portion is defined by a third dimension that decreases gradually from the first portion to the second portion, the first dimension, the second dimension, and the third dimension being measured along a lengthwise direction of the first semiconductor fin and the second semiconductor fin, and
wherein the first semiconductor fin and the second semiconductor fin are separated by a distance S, and the distance S increases with an increasing difference between the first dimension and the second dimension.

7. The semiconductor structure of claim 6, wherein each of the first semiconductor fin and the second semiconductor fin includes a stack of semiconductor layers interleaved with a portion of the metal gate structure.

8. The semiconductor structure of claim 6, wherein a difference between the first dimension and the second dimension is 0.5 nm to 5 nm.

9. The semiconductor structure of claim 6, wherein the third portion is defined by a smooth profile having rounded corners when viewed in a top view.

10. The semiconductor structure of claim 6, wherein the third portion is defined by a trapezoidal profile having sharp corners when viewed in a top view.

11. The semiconductor structure of claim 6, wherein the metal gate structure includes a metal gate electrode disposed over a gate dielectric layer, and wherein the metal gate electrode includes a bulk layer disposed over a work function metal (WFM) layer.

12. The semiconductor structure of claim 11, wherein the WFM layer in the second portion of the metal gate structure has a same composition as the WFM layer in the first portion of the metal gate structure, and wherein the second device has a lower threshold voltage ($V_t$) than the first device.

13. The semiconductor structure of claim 6, wherein the first device is configured as a low-leakage device and the second device is configured as a high-speed device.

14. A semiconductor structure, comprising:
a first active region and a second active region protruding from a substrate and extending lengthwise along a first direction; and
a gate structure engaging the first active region and the second active region and extending lengthwise along a second direction perpendicular to the first direction,
wherein the gate structure has a non-uniform width along the second direction and comprises:
a first portion disposed directly over a channel region of the first active region and comprising a first uniform width;
a second portion disposed directly over a channel region of the second active region and comprising a second uniform width less than the first uniform width, and
a third portion disposed between the first active region and the second active region and comprising a non-uniform width that gradually and continuously decreases from the first uniform width to the second uniform width.

15. The semiconductor structure of claim 14, wherein a channel region of the first active region comprises a plurality of nanostructures.

16. The semiconductor structure of claim 14, wherein the first portion of the gate structure and the first active region are parts of a first transistor, and the second portion of the gate structure and second active region are parts of a second transistor, a threshold voltage of the first transistor is different than a threshold voltage of the second transistor.

17. The semiconductor structure of claim 14, wherein the third portion is defined by a smooth profile having rounded corners when viewed in a top view.

18. The semiconductor structure of claim 14, wherein the third portion is defined by a trapezoidal profile having sharp corners when viewed in a top view.

19. The semiconductor structure of claim 14, wherein a channel region of the first active region comprises a uniform composition.

20. The semiconductor structure of claim 14, further comprising: another gate structure disposed adjacent to the gate structure and engaging the first active region and the second active region, wherein the another gate structure has a uniform width along the second direction.

* * * * *